(12) United States Patent
Berkovich et al.

(10) Patent No.: US 11,888,002 B2
(45) Date of Patent: Jan. 30, 2024

(54) DYNAMICALLY PROGRAMMABLE IMAGE SENSOR

(71) Applicant: Meta Platforms Technologies, LLC, Menlo Park, CA (US)

(72) Inventors: Andrew Samuel Berkovich, Bellevue, WA (US); Xinqiao Liu, Medina, WA (US); Hans Reyserhove, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/716,050

(22) Filed: Dec. 16, 2019

(65) Prior Publication Data

US 2020/0195875 A1 Jun. 18, 2020

Related U.S. Application Data

(60) Provisional application No. 62/780,743, filed on Dec. 17, 2018.

(51) Int. Cl.
*H04N 5/3745* (2011.01)
*H04N 5/341* (2011.01)
(Continued)

(52) U.S. Cl.
CPC ...... *H01L 27/14609* (2013.01); *G06V 10/147* (2022.01); *G06V 10/25* (2022.01);
(Continued)

(58) Field of Classification Search
CPC .. H04N 5/3745; H04N 5/341; H04N 5/23225; H04N 5/3698; H04N 5/232;
(Continued)

(56) References Cited

U.S. PATENT DOCUMENTS 4,121,896 A 10/1978 Shepherd
6,384,905 B1 5/2002 Barrows
(Continued)

FOREIGN PATENT DOCUMENTS

CN 103207716 A 7/2013
CN 103907133 A 7/2014
(Continued)

OTHER PUBLICATIONS

Advisory Action dated Oct. 1, 2021 for U.S. Appl. No. 17/083,920, filed Oct. 29, 2020, 4 pages.
(Continued)

*Primary Examiner* — Pritham D Prabhakher
(74) *Attorney, Agent, or Firm* — Kilpatrick Townsend & Stockton LLP

(57) ABSTRACT

In one example, an apparatus comprises: an image sensor comprising an array of pixel cells, each pixel cell including a photodiode and circuits to generate image data, the photodiodes formed in a first semiconductor substrate; and a controller formed in one or more second semiconductor substrates that include the circuits of the array of pixel cells, the first and second semiconductor substrates forming a stack and housed within a semiconductor package. The controller is configured to: determine whether first image data generated by the image sensor contain features of an object; based on whether the first image data contain the features of the object, generate programming signals for the image sensor; and control, based on the programming signals, the image sensor to generate second image data.

20 Claims, 20 Drawing Sheets

(51) Int. Cl.

| | |
|---|---|
| *H04N 5/369* | (2011.01) |
| *H04N 5/232* | (2006.01) |
| *G06V 10/25* | (2022.01) |
| *H01L 27/146* | (2006.01) |
| *H04N 25/77* | (2023.01) |
| *H04N 23/617* | (2023.01) |
| *H04N 25/40* | (2023.01) |
| *H04N 25/709* | (2023.01) |
| *G06V 30/24* | (2022.01) |
| *G06V 10/764* | (2022.01) |
| *G06V 10/82* | (2022.01) |
| *G06V 10/147* | (2022.01) |
| *G06V 20/20* | (2022.01) |

(52) U.S. Cl.
CPC ............ *G06V 10/764* (2022.01); *G06V 10/82* (2022.01); *G06V 20/20* (2022.01); *G06V 30/2504* (2022.01); *H04N 23/617* (2023.01); *H04N 25/40* (2023.01); *H04N 25/709* (2023.01); *H04N 25/77* (2023.01)

(58) Field of Classification Search
CPC .......... H04N 5/23227; H04N 5/23241; H04N 5/37455; H04N 5/379; H04N 5/351; H04N 5/23218; H04N 5/3454; H04N 5/3535; H04N 5/332; G06K 9/3233; G06K 9/6857; G06K 9/209; G06K 9/00671; H01L 27/144; H01L 27/14609
See application file for complete search history.

(56) References Cited

U.S. PATENT DOCUMENTS

| | | | |
|---|---|---|---|
| 6,853,579 B1 | 2/2005 | Chou | |
| 7,359,275 B1 | 4/2008 | Wu | |
| 7,362,355 B1 | 4/2008 | Yang et al. | |
| 7,659,925 B2 | 2/2010 | Krymski | |
| 7,920,409 B1 | 4/2011 | Clark et al. | |
| 7,956,914 B2* | 6/2011 | Xu | H04N 5/35581 |
| | | | 348/308 |
| 7,969,759 B1 | 6/2011 | Thummalapally et al. | |
| 8,134,623 B2 | 3/2012 | Purcell et al. | |
| 8,441,535 B2 | 5/2013 | Morin | |
| 8,675,110 B2* | 3/2014 | Hirai | H04N 23/673 |
| | | | 348/333.12 |
| 8,779,346 B2 | 7/2014 | Fowler et al. | |
| 9,094,629 B2 | 7/2015 | Ishibashi | |
| 9,210,330 B2* | 12/2015 | Seo | H04N 25/134 |
| 9,282,264 B2 | 3/2016 | Park et al. | |
| 9,363,454 B2 | 6/2016 | Ito et al. | |
| 9,560,296 B2 | 1/2017 | Hseih et al. | |
| 9,646,681 B1 | 5/2017 | Jung et al. | |
| 9,723,233 B2* | 8/2017 | Grauer | H01L 27/14643 |
| 9,743,024 B2* | 8/2017 | Tyrrell | H04N 25/00 |
| 9,826,175 B2 | 11/2017 | Isobe | |
| 9,832,370 B2* | 11/2017 | Cho | A61B 5/0037 |
| 9,912,885 B2* | 3/2018 | Isobe | H04N 5/3454 |
| 9,955,091 B1 | 4/2018 | Dai et al. | |
| 10,007,350 B1 | 6/2018 | Holz et al. | |
| 10,090,342 B1* | 10/2018 | Gambino | H01L 27/14609 |
| 10,096,631 B2 | 10/2018 | Ishizu | |
| 10,154,221 B2* | 12/2018 | Ogino | H04N 5/378 |
| 10,157,951 B2* | 12/2018 | Kim | H04N 5/37457 |
| 10,274,730 B2 | 4/2019 | Jepsen et al. | |
| 10,321,081 B2* | 6/2019 | Watanabe | H04N 5/37452 |
| 10,345,447 B1 | 7/2019 | Hicks | |
| 10,484,628 B2 | 11/2019 | Zhang et al. | |
| 10,515,284 B2 | 12/2019 | Gousev et al. | |
| 10,594,974 B2* | 3/2020 | Ivarsson | G06F 3/013 |
| 10,607,413 B1 | 3/2020 | Marcolina et al. | |
| 10,715,824 B2 | 7/2020 | Tall et al. | |
| 10,726,627 B2* | 7/2020 | Liu | G06K 9/6256 |
| 10,867,655 B1 | 12/2020 | Harms et al. | |
| 10,897,586 B2 | 1/2021 | Liu et al. | |
| 10,915,995 B2* | 2/2021 | Moloney | G06V 10/454 |
| 10,939,062 B2* | 3/2021 | Ogawa | H04N 25/75 |
| 10,970,619 B1 | 4/2021 | Xiao et al. | |
| 10,984,235 B2* | 4/2021 | Gousev | G06V 40/18 |
| 10,999,539 B2 | 5/2021 | Wendel et al. | |
| 11,057,581 B2 | 7/2021 | Liu | |
| 11,126,497 B2 | 9/2021 | Oh et al. | |
| 11,204,835 B2 | 12/2021 | Lu et al. | |
| 11,568,609 B1 | 1/2023 | Liu et al. | |
| 11,630,724 B2 | 4/2023 | Shin et al. | |
| 2002/0113886 A1 | 8/2002 | Hynecek | |
| 2003/0005231 A1 | 1/2003 | Ooi et al. | |
| 2003/0020100 A1 | 1/2003 | Guidash | |
| 2005/0057389 A1 | 3/2005 | Krymski | |
| 2005/0058773 A1 | 3/2005 | Hasei et al. | |
| 2005/0073874 A1 | 4/2005 | Chan et al. | |
| 2005/0237380 A1 | 10/2005 | Kakii et al. | |
| 2006/0224792 A1 | 10/2006 | Ooi | |
| 2007/0076109 A1 | 4/2007 | Krymski | |
| 2007/0222881 A1 | 9/2007 | Mentzer | |
| 2008/0007731 A1 | 1/2008 | Botchway et al. | |
| 2008/0055736 A1 | 3/2008 | Tsuji et al. | |
| 2008/0226170 A1 | 9/2008 | Sonoda | |
| 2009/0033588 A1 | 2/2009 | Kajita et al. | |
| 2009/0245637 A1 | 10/2009 | Barman et al. | |
| 2010/0194956 A1 | 8/2010 | Yuan et al. | |
| 2010/0197821 A1 | 8/2010 | Jeong et al. | |
| 2010/0197876 A1 | 8/2010 | Lyu et al. | |
| 2010/0245600 A1 | 9/2010 | Chang et al. | |
| 2010/0276572 A1 | 11/2010 | Iwabuchi et al. | |
| 2011/0055461 A1 | 3/2011 | Steiner et al. | |
| 2011/0075470 A1 | 3/2011 | Liaw | |
| 2011/0155892 A1 | 6/2011 | Neter et al. | |
| 2011/0254986 A1 | 10/2011 | Nishimura et al. | |
| 2011/0267362 A1 | 11/2011 | Handschy et al. | |
| 2012/0002459 A1 | 1/2012 | Rimondi et al. | |
| 2012/0002460 A1 | 1/2012 | Rimondi et al. | |
| 2012/0044399 A1 | 2/2012 | Hirai et al. | |
| 2012/0086082 A1 | 4/2012 | Malinge et al. | |
| 2012/0105475 A1 | 5/2012 | Tseng | |
| 2012/0105668 A1* | 5/2012 | Velarde | H04N 5/2354 |
| | | | 348/229.1 |
| 2012/0113119 A1 | 5/2012 | Massie | |
| 2012/0133807 A1 | 5/2012 | Wu et al. | |
| 2012/0161088 A1 | 6/2012 | Choi et al. | |
| 2012/0198312 A1 | 8/2012 | Kankani et al. | |
| 2012/0200499 A1 | 8/2012 | Osterhout et al. | |
| 2012/0212465 A1 | 8/2012 | White et al. | |
| 2012/0240007 A1 | 9/2012 | Barndt et al. | |
| 2012/0262616 A1 | 10/2012 | Sa et al. | |
| 2013/0056809 A1 | 3/2013 | Mao et al. | |
| 2013/0057742 A1 | 3/2013 | Nakamura et al. | |
| 2013/0068929 A1 | 3/2013 | Solhusvik et al. | |
| 2013/0069787 A1 | 3/2013 | Petrou | |
| 2013/0141619 A1 | 6/2013 | Lim et al. | |
| 2013/0185609 A1 | 7/2013 | Park et al. | |
| 2013/0187027 A1 | 7/2013 | Qiao et al. | |
| 2013/0198577 A1 | 8/2013 | Oh et al. | |
| 2013/0207219 A1 | 8/2013 | Ahn | |
| 2013/0215290 A1 | 8/2013 | Solhusvik et al. | |
| 2013/0293753 A1 | 11/2013 | Keelan et al. | |
| 2013/0299674 A1 | 11/2013 | Fowler et al. | |
| 2013/0300009 A1 | 11/2013 | Oganesian et al. | |
| 2013/0314591 A1 | 11/2013 | Eromaki | |
| 2013/0326116 A1 | 12/2013 | Goss et al. | |
| 2014/0042299 A1 | 2/2014 | Wan et al. | |
| 2014/0055635 A1 | 2/2014 | Seo | |
| 2014/0063250 A1 | 3/2014 | Park | |
| 2014/0170345 A1 | 6/2014 | Aoshima et al. | |
| 2014/0247382 A1* | 9/2014 | Moldovan | H04N 5/378 |
| | | | 348/311 |
| 2014/0368687 A1 | 12/2014 | Yu et al. | |
| 2015/0050479 A1 | 2/2015 | Nakamura et al. | |
| 2015/0050480 A1 | 2/2015 | Suzuki et al. | |
| 2015/0085134 A1 | 3/2015 | Novotny et al. | |
| 2015/0158259 A1 | 6/2015 | Yamamoto et al. | |
| 2015/0189209 A1 | 7/2015 | Yang et al. | |

(56) References Cited

U.S. PATENT DOCUMENTS

| | | |
|---|---|---|
| 2015/0201142 A1 | 7/2015 | Smith et al. |
| 2015/0222827 A1* | 8/2015 | Isobe .................. H04N 5/3532 |
| | | 348/296 |
| 2015/0229859 A1 | 8/2015 | Guidash et al. |
| 2015/0279884 A1 | 10/2015 | Kusumoto |
| 2015/0309311 A1 | 10/2015 | Cho |
| 2015/0309316 A1 | 10/2015 | Osterhout et al. |
| 2015/0312502 A1 | 10/2015 | Borremans |
| 2015/0358571 A1* | 12/2015 | Dominguez Castro ..................... |
| | | H04N 5/37452 |
| | | 348/308 |
| 2015/0381911 A1 | 12/2015 | Shen et al. |
| 2016/0011422 A1 | 1/2016 | Thurber et al. |
| 2016/0018645 A1 | 1/2016 | Haddick et al. |
| 2016/0021302 A1 | 1/2016 | Cho et al. |
| 2016/0028974 A1 | 1/2016 | Guidash et al. |
| 2016/0032074 A1 | 2/2016 | Aizenberg et al. |
| 2016/0078614 A1 | 3/2016 | Ryu et al. |
| 2016/0088253 A1 | 3/2016 | Tezuka |
| 2016/0100115 A1 | 4/2016 | Kusano |
| 2016/0165160 A1* | 6/2016 | Hseih .................. H04N 5/35581 |
| | | 348/308 |
| 2016/0210785 A1 | 7/2016 | Balachandreswaran et al. |
| 2016/0344965 A1 | 11/2016 | Grauer et al. |
| 2016/0360127 A1 | 12/2016 | Dierickx et al. |
| 2017/0039906 A1 | 2/2017 | Jepsen |
| 2017/0041571 A1 | 2/2017 | Tyrrell et al. |
| 2017/0117310 A1 | 4/2017 | Tatani et al. |
| 2017/0154909 A1 | 6/2017 | Ishizu |
| 2017/0161579 A1* | 6/2017 | Gousev .................. G06F 1/1686 |
| 2017/0228345 A1 | 8/2017 | Gupta et al. |
| 2017/0248789 A1 | 8/2017 | Yokoyama |
| 2017/0270664 A1 | 9/2017 | Hoogi et al. |
| 2017/0272768 A1* | 9/2017 | Tall ...................... H04N 19/167 |
| 2017/0280031 A1 | 9/2017 | Price et al. |
| 2017/0293799 A1* | 10/2017 | Skogö .................. H01L 27/14649 |
| 2017/0307887 A1 | 10/2017 | Stenberg et al. |
| 2017/0310910 A1 | 10/2017 | Smith et al. |
| 2017/0338262 A1* | 11/2017 | Hirata .................. H04N 5/341 |
| 2017/0339327 A1 | 11/2017 | Koshkin et al. |
| 2018/0027174 A1 | 1/2018 | Sengoku |
| 2018/0115725 A1 | 4/2018 | Zhang et al. |
| 2018/0136471 A1 | 5/2018 | Miller et al. |
| 2018/0143701 A1 | 5/2018 | Suh et al. |
| 2018/0167575 A1 | 6/2018 | Watanabe et al. |
| 2018/0176545 A1 | 6/2018 | Aflaki Beni |
| 2018/0204867 A1* | 7/2018 | Kim .................. H01L 27/14627 |
| 2018/0211582 A1 | 7/2018 | Sakariya et al. |
| 2018/0224658 A1 | 8/2018 | Teller |
| 2018/0239108 A1 | 8/2018 | Ishii et al. |
| 2018/0241953 A1 | 8/2018 | Johnson |
| 2018/0252857 A1 | 9/2018 | Glik et al. |
| 2018/0270436 A1* | 9/2018 | Ivarsson .................. H04N 5/345 |
| 2018/0276841 A1 | 9/2018 | Krishnaswamy et al. |
| 2018/0284594 A1 | 10/2018 | Gao |
| 2019/0019023 A1 | 1/2019 | Konttori et al. |
| 2019/0027454 A1 | 1/2019 | Chen et al. |
| 2019/0035154 A1 | 1/2019 | Liu |
| 2019/0046044 A1 | 2/2019 | Tzvieli et al. |
| 2019/0098232 A1* | 3/2019 | Mori .................... H04N 5/378 |
| 2019/0110039 A1 | 4/2019 | Linde et al. |
| 2019/0123088 A1* | 4/2019 | Kwon .................. H01L 27/14636 |
| 2019/0149751 A1 | 5/2019 | Wise |
| 2019/0172227 A1 | 6/2019 | Kasahara |
| 2019/0191116 A1 | 6/2019 | Madurawe |
| 2019/0199946 A1* | 6/2019 | Wendel .................. H04N 5/3452 |
| 2019/0204527 A1 | 7/2019 | Nakajima |
| 2019/0246036 A1 | 8/2019 | Wu et al. |
| 2019/0253650 A1 | 8/2019 | Kim |
| 2019/0307313 A1 | 10/2019 | Wade |
| 2019/0331914 A1 | 10/2019 | Lee et al. |
| 2019/0361250 A1 | 11/2019 | Lanman et al. |
| 2019/0363118 A1 | 11/2019 | Berkovich et al. |
| 2020/0035661 A1 | 1/2020 | Yu et al. |
| 2020/0053299 A1 | 2/2020 | Zhang et al. |
| 2020/0098096 A1* | 3/2020 | Moloney .................. G06V 20/00 |
| 2020/0193206 A1 | 6/2020 | Turkelson et al. |
| 2020/0195828 A1 | 6/2020 | Reyserhove et al. |
| 2020/0195875 A1 | 6/2020 | Berkovich et al. |
| 2020/0273784 A1 | 8/2020 | Mallik et al. |
| 2021/0026796 A1 | 1/2021 | Graif et al. |
| 2021/0110187 A1 | 4/2021 | Pillai et al. |
| 2021/0118847 A1 | 4/2021 | Chuang et al. |
| 2021/0142086 A1 | 5/2021 | Berkovich et al. |
| 2021/0185264 A1 | 6/2021 | Wong et al. |
| 2021/0227159 A1 | 7/2021 | Sambonsugi |
| 2021/0264679 A1 | 8/2021 | Liu et al. |
| 2021/0283871 A1 | 9/2021 | Lee et al. |
| 2021/0306586 A1 | 9/2021 | Yamamoto et al. |
| 2021/0368124 A1 | 11/2021 | Berkovich et al. |
| 2021/0409625 A1 | 12/2021 | Zhu et al. |
| 2022/0021833 A1 | 1/2022 | Berkovich |
| 2022/0076726 A1 | 3/2022 | Hulton et al. |

FOREIGN PATENT DOCUMENTS

| | | |
|---|---|---|
| CN | 104204904 A | 12/2014 |
| CN | 106255978 A | 12/2016 |
| CN | 106791504 A | 5/2017 |
| CN | 107005641 A | 8/2017 |
| CN | 109298528 A | 2/2019 |
| DE | 102015122055 A1 | 6/2017 |
| EP | 0775591 A2 | 5/1997 |
| EP | 1603170 A1 | 12/2005 |
| EP | 1746820 A1 | 1/2007 |
| EP | 1788802 | 5/2007 |
| EP | 2037505 A1 | 3/2009 |
| EP | 2228846 A1 | 9/2010 |
| EP | 2330173 A2 | 6/2011 |
| EP | 2357679 A2 | 8/2011 |
| EP | 2804074 A2 | 11/2014 |
| EP | 3229457 | 10/2017 |
| EP | 3833005 A1 | 6/2021 |
| JP | 2003319262 A | 11/2003 |
| JP | 2005129139 A | 5/2005 |
| JP | 2006348085 A | 12/2006 |
| JP | 2008270500 A | 11/2008 |
| JP | 2013043383 A | 3/2013 |
| KR | 20110100974 A | 9/2011 |
| WO | 2014055391 A2 | 4/2014 |
| WO | 2016095057 A1 | 6/2016 |
| WO | 2017003477 A1 | 1/2017 |
| WO | 2017013806 A1 | 1/2017 |
| WO | 2017047010 | 3/2017 |
| WO | 2018231962 A1 | 12/2018 |
| WO | 2019018084 A1 | 1/2019 |
| WO | 2019111528 A1 | 6/2019 |
| WO | 2019145578 A1 | 8/2019 |
| WO | 2019178060 A1 | 9/2019 |
| WO | 2019244142 A2 | 12/2019 |
| WO | 2020077283 A1 | 4/2020 |

OTHER PUBLICATIONS

International Preliminary Report on Patentability for International Application No. PCT/US2020/044807, dated Feb. 17, 2022, 10 pages.

Notice of Allowance dated Feb. 14, 2022 for U.S. Appl. No. 16/715,792, filed Dec. 16, 2019, 9 pages.

Notice of Allowance dated Feb. 22, 2022 for U.S. Appl. No. 17/083,920, filed Oct. 29, 2020, 10 pages.

U.S. Appl. No. 16/421,441, "Non-Final Office Action", dated May 7, 2021, 17 pages.

U.S. Appl. No. 17/083,920, "Final Office Action", dated Jul. 28, 2021, 19 pages.

U.S. Appl. No. 17/083,920, "Non-Final Office Action", dated Apr. 21, 2021, 17 pages.

U.S. Appl. No. 16/715,792, "Notice of Allowance", dated Apr. 16, 2021, 10 pages.

PCT/US2020/044807, "International Search Report and Written Opinion", dated Sep. 30, 2020, 12 pages.

(56) References Cited

OTHER PUBLICATIONS

PCT/US2020/059636, "International Search Report and Written Opinion", dated Feb. 11, 2021, 18 pages.
U.S. Appl. No. 16/715,792, "Notice of Allowance", dated Aug. 25, 2021, 9 pages.
U.S. Appl. No. 17/083,920, "Advisory Action", dated Oct. 1, 2021, 4 pages.
PCT/US2021/033321, "International Search Report and Written Opinion", dated Sep. 6, 2021, 11 pages.
PCT/US2021/041775, "Invitation to Pay Additional Fees and, Where Applicable, Protest Fee", dated Oct. 8, 2021, 12 pages.
Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.
Cho K., et al., "A Low Power Dual CDS for a Column-Parallel CMOS Image Sensor," Journal of Semiconductor Technology and Science, Dec. 30, 2012, vol. 12 (4), pp. 388-396.
Chuxi L., et al., "A Memristor-Based Processing-in-Memory Architechture for Deep Convolutional Neural Networks Approximate Computation," Journal of Computer Research and Development, Jun. 30, 2017, vol. 54 (6), pp. 1367-1380.
Corrected Notice of Allowability dated Apr. 9, 2021 for U.S. Appl. No. 16/255,528, filed Jan. 23, 2019, 5 Pages.
Extended European Search Report for European Application No. 18179846.3, dated Dec. 7, 2018, 10 Pages.
Extended European Search Report for European Application No. 18179851.3, dated Dec. 7, 2018, 8 Pages.
Extended European Search Report for European Application No. 19743908.6, dated Sep. 30, 2020, 9 Pages.
Final Office Action dated Oct. 21, 2021 for U.S. Appl. No. 16/421,441, filed May 23, 2019, 23 Pages.
Final Office Action dated Jan. 27, 2021 for U.S. Appl. No. 16/255,528, filed Jan. 23, 2019, 31 Pages.
International Search Report and Written Opinion for International Application No. PCT/US2018/039350, dated Nov. 15, 2018, 11 Pages.
International Search Report and Written Opinion for International Application No. PCT/US2018/039352, dated Oct. 26, 2018, 8 Pages.
International Search Report and Written Opinion for International Application No. PCT/US2018/039431, dated Nov. 7, 2018, 12 Pages.
International Search Report and Written Opinion for International Application No. PCT/US2020/058097, dated Feb. 12, 2021, 09 Pages.
International Search Report and Written Opinion for International Application No. PCT/US2021/031201, dated Aug. 2, 2021, 13 Pages.
International Search Report and Written Opinion for International Application No. PCT/US2021/033321, dated Sep. 6, 2021, 11 pages.
Millet L., et al., "A 5500-Frames/s 85-GOPS/W 3-D Stacked BSI Vision Chip Based on Parallel In-Focal-Plane Acquisition and Processing," IEEE Journal of Solid-State Circuits, USA, Apr. 1, 2019, vol. 54 (4), pp. 1096-1105, XP011716786.
Non-Final Office Action dated Sep. 2, 2021 for U.S. Appl. No. 16/910,844, filed Jun. 24, 2020, 7 Pages.
Non-Final Office Action dated Jul. 10, 2020 for U.S. Appl. No. 16/255,528, filed Jan. 23, 2019, 27 Pages.
Non-Final Office Action dated Oct. 21, 2021 for U.S. Appl. No. 17/083,920, filed Oct. 29, 2020, 19 Pages.
Non-Final Office Action dated Nov. 23, 2018 for U.S. Appl. No. 15/847,517, filed Dec. 19, 2017, 21 Pages.
Non-Final Office Action dated Jul. 25, 2019 for U.S. Appl. No. 15/909,162, filed Mar. 1, 2018, 20 Pages.
Notice of Allowance dated Apr. 1, 2021 for U.S. Appl. No. 16/255,528, filed Jan. 23, 2019, 7 Pages.
Notice of Allowance dated Mar. 18, 2020 for U.S. Appl. No. 15/909,162, filed Mar. 1, 2018, 9 Pages.
Notice of Allowance dated Dec. 22, 2021 for U.S. Appl. No. 16/910,844, filed Jun. 24, 2020, 7 pages.
Notice of Allowance dated Nov. 24, 2021 for U.S. Appl. No. 16/910,844, filed Jun. 24, 2020, 8 pages.
Notice of Allowance dated Aug. 25, 2021 for U.S. Appl. No. 16/715,792, filed Dec. 16, 2019, 9 Pages.
Office Action dated Jul. 3, 2020 for Chinese Application No. 201810821296, filed Jul. 24, 2018, 17 Pages.
Office Action dated Mar. 9, 2021 for Chinese Application No. 201810821296, filed Jul. 24, 2018, 10 Pages.
Office Action dated Jun. 28, 2020 for Chinese Application No. 201810821296, filed Jul. 24, 2018, 2 Pages.
Partial European Search Report for European Application No. 18179838.0, dated Dec. 5, 2018, 13 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.
International Application No. PCT/US2019/066831, International Search Report and Written Opinion dated Feb. 27, 2020, 15 pages.
U.S. Appl. No. 16/715,792, "Non-Final Office Action", dated Jan. 1, 2021, 15 pages.
PCT/US2019/034007, "International Search Report and Written Opinion", dated Oct. 28, 2019, 19 pages.
PCT/US2019/066805, "International Search Report and Written Opinion", dated Mar. 6, 2020, 13 pages.
Amir M.F., et al., "NeuroSensor: A 3D Image Sensor with Integrated Neural Accelerator," IEEE SOI-3D-Subthreshold Microelectronics Technology Unified Conference (S3S), Oct. 2016, pp. 1-2.
Corrected Notice of Allowance dated Apr. 18, 2023 for U.S. Appl. No. 17/127,670, filed Mar. 5, 2021, 2 pages.
Devlin N.R., et al., "Patterning Decomposable Polynorbornene with Electron Beam Lithography to Create Nanochannels," Journal of Vacuum Science and Technology, vol. 27, No. 6, Dec. 1, 2009, pp. 2508-2511.
Dong J., et al., "Self-Assembly of Highly Stable Zirconium(IV) Coordination Cages with Aggregation Induced Emission Molecular Rotors for Live-Cell Imaging," Angewandte Chemie International Edition, vol. 59, No. 25, Jun. 15, 2020, 10 pages.
International Preliminary Report on Patentability for International Application No. PCT/US2020/058439, dated Jun. 23, 2022, 11 pages.
International Preliminary Report on Patentability for International Application No. PCT/US2020/059560, dated Jun. 16, 2022, 8 pages.
International Preliminary Report on Patentability for International Application No. PCT/US2020/061218, dated Jun. 9, 2022, 9 pages.
International Preliminary Report on Patentability for International Application No. PCT/US2020/062991, dated Jul. 7, 2022, 8 pages.
International Preliminary Report on Patentability for International Application No. PCT/US2020/066992, dated Jul. 7, 2022, 27 pages.
International Preliminary Report on Patentability for International Application No. PCT/US2021/014970, dated Sep. 9, 2022, 7 pages.
International Preliminary Report on Patentability for International Application No. PCT/US2021/016158, dated Aug. 18, 2022, 7 pages.
International Search Report and Written Opinion for International Application No. PCT/US2020/056758, dated Feb. 17, 2021, 11 Pages.
International Search Report and Written Opinion for International Application No. PCT/US2020/058439, dated Apr. 6, 2021, 16 Pages.
International Search Report and Written Opinion for International Application No. PCT/US2020/059560, dated Feb. 9, 2021, 9 Pages.
International Search Report and Written Opinion for International Application No. PCT/US2020/061218, dated Feb. 16, 2021, 11 pages.

(56) References Cited

OTHER PUBLICATIONS

International Search Report and Written Opinion for International Application No. PCT/US2020/062991, dated Feb. 24, 2021, 9 Pages.
International Search Report and Written Opinion for International Application No. PCT/US2020/066992, dated May 17, 2021, 31 Pages.
International Search Report and Written Opinion for International Application No. PCT/US2021/014970, dated Apr. 26, 2021, 8 Pages.
Khaled S.R., "A Review of Piezoelectric Polymers as Functional Materials for Electromechanical Transducers," Smart Materials and Structures, IOP Publishing LTD, Bristol, GB, Jan. 20, 2014 [retrieved on Jan. 20, 2014], vol. 23 (3), Article 33001,29 pages, XP020258249, Issn: 0964-1726, DOI: 10.1088/0964-1726/23/3/033001.
Levola T., "Diffractive Optics for Virtual Reality Displays," Journal of the Society for Information Display—SID, May 2006, vol. 14 (5), pp. 467-475, XP008093627.
Non-Final Office Action dated Jul. 22, 2021 for U.S. Appl. No. 16/834,605, filed Mar. 30, 2020, 12 pages, [FACTP103US].
Non-Final Office Action dated Jun. 30, 2023 for U.S. Appl. No. 17/556,436, filed Dec. 20, 2021,25 pages.
Notice of Allowance dated May 15, 2023 for U.S. Appl. No. 16/421,441, filed May 23, 2019, 10 pages.
Notice of Allowance dated Aug. 16, 2023 for U.S. Appl. No. 16/715,792, filed Dec. 16, 2019, 9 pages.
Notice of Allowance dated Jul. 18, 2023 for U.S. Appl. No. 17/091,331, filed Nov. 6, 2020, 7 pages.
Notice of Allowance dated Apr. 19, 2023 for U.S. Appl. No. 16/715,792, filed Dec. 16, 2019, 9 pages.
Notice of Allowance dated Aug. 22, 2023 for U.S. Appl. No. 17/992,648, filed Nov. 22, 2022, 10 pages.
Notice of Allowance dated Mar. 22, 2022 for U.S. Appl. No. 16/834,605, filed Mar. 30, 2020, 8 pages, [FACTP103US].
Notice of Allowance dated May 22, 2023 for U.S. Appl. No. 17/324,803, filed May 19, 2021,5 pages.
Notice of Allowance dated May 31, 2022 for U.S. Appl. No. 16/706,859, filed Dec. 9, 2019, 13 pages.
Office Action dated Mar. 23, 2023 for Chinese Application No. 201980083991.5, filed Jun. 17, 2021,21 pages.
Notice of Allowance dated Sep. 2, 2022 for U.S. Appl. No. 16/715,792, filed Dec. 16, 2019, 9 pages.
Office Action dated Aug. 17, 2022 for Chinese Application No. 201980083991.5, filed Jun. 17, 2021, 24 pages.
Non-Final Office Action dated Mar. 2, 2022 for U.S. Appl. No. 17/127,670, filed Dec. 18, 2020, 18 pages.
Office Action dated Apr. 5, 2022 for European Patent Application No. 19731047.7, filed May 24, 2019, 7 pages.
Final Office Action dated Apr. 12, 2023 for U.S. Appl. No. 16/983,863, filed Aug. 3, 2020, 21 pages.
International Search Report and Written Opinion for International Application No. PCT/US2023/011630, dated Apr. 6, 2023, 10 pages.
Non-Final Office Action dated Feb. 2, 2023 for U.S. Appl. No. 17/469,258, filed Sep. 8, 2021, 17 pages.
Non-Final Office Action dated Mar. 6, 2023 for U.S. Appl. No. 17/992,648, filed Nov. 22, 2022,24 pages.
Notice of Allowance dated Feb. 7, 2023 for U.S. Appl. No. 17/083,920, filed Oct. 29, 2020, 10 pages.
Notice of Allowance dated Feb. 8, 2023 for U.S. Appl. No. 17/324,803, filed May 19, 2021, 8 pages.
Notice of Allowance dated Mar. 27, 2023 for U.S. Appl. No. 17/127,670, filed Dec. 18, 2020, 9 pages.
Notice of Allowance dated Mar. 28, 2023 for U.S. Appl. No. 17/091,331, filed Nov. 6, 2020, 5 pages.
Office Action dated Feb. 11, 2023 for Chinese Application No. 201980048866.0, filed May 24, 2019, 20 Pages.
Office Action dated Feb. 13, 2023 for Taiwan Application No. 108146255, filed Dec. 17, 2019, 30 pages.
Office Action dated Mar. 14, 2023 for Taiwan Application No. 108146257, filed Dec. 17, 2019, 25 pages.
Notice of Allowance dated May 23, 2022 for U.S. Appl. No. 17/324,803, filed May 19, 2021, 9 pages.
Notice of Allowance dated May 24, 2022 for U.S. Appl. No. 16/715,792, filed Dec. 16, 2019, 9 pages.
Notice of Allowance dated Jun. 3, 2022 for U.S. Appl. No. 17/324,803, filed May 19, 2021, 6 pages.
Notice of Allowance dated Jun. 17, 2022 for U.S. Appl. No. 16/715,792, filed Dec. 16, 2019, 2 pages.
Notice of Allowance dated Aug. 24, 2022 for U.S. Appl. No. 17/091,331, filed Nov. 6, 2020, 9 pages.
Notice of Allowance dated Jun. 24, 2022 for U.S. Appl. No. 16/421,441, filed May 23, 2019, 17 pages.
Office Action dated Aug. 11, 2022 for European Patent Application No. 19731047.7, filed May 24, 2019, 10 pages.
Office Action dated Jul. 29, 2022 for Taiwan Application No. 108118209, filed May 27, 2019, 15 pages.
Final Office Action dated Oct. 6, 2022 for U.S. Appl. No. 17/127,670, filed Dec. 18, 2020, 20 pages.
International Search Report and Written Opinion for International Application No. PCT/US2022/034259, dated Oct. 21, 2022, 10 pages.
Non-Final Office Action dated Nov. 2, 2022 for U.S. Appl. No. 16/983,863, filed Aug. 3, 2020, 20 pages.

\* cited by examiner

DYNAMICALLY PROGRAMMABLE IMAGE SENSOR

RELATED APPLICATION

This patent application claims priority to U.S. Provisional Patent Application Ser. No. 62/780,743, filed Dec. 17, 2018, entitled "SYSTEM ENABLING PERFORMANCE-DRIVEN SENSOR-HARDWARE CO-OPTIMIZATION," which is assigned to the assignee hereof and is incorporated herein by reference in its entirety for all purposes.

BACKGROUND

The disclosure relates generally to image sensors, and more specifically to dynamically programmable image sensors.

A typical image sensor includes an array of pixel cells. Each pixel cell may include a photodiode to sense light by converting photons into charge (e.g., electrons or holes). The charge converted at each pixel cell can be quantized to become a digital pixel value, and an image can be generated from an array of digital pixel values. The operations of the array of pixel cells can be configured based on pre-determined programming signals.

SUMMARY

The present disclosure relates to image sensors. More specifically, and without limitation, this disclosure relates to an image sensor that is dynamically programmable by an integrated controller based on image data captured by the image sensor.

In one example, an apparatus comprises: an image sensor comprising an array of pixel cells, each pixel cell including a photodiode and circuits to generate image data, the photodiodes being formed in a first semiconductor substrate; and a controller formed in one or more second semiconductor substrates that include the circuits of the array of pixel cells, the first and second semiconductor substrates forming a stack and housed within a semiconductor package. The controller is configured to: determine whether first image data generated by the image sensor contain features of an object; based on whether the first image data contain the features of the object, generate programming signals for the image sensor; and control, based on the programming signals, the image sensor to generate second image data.

In some aspects, the apparatus further includes an image processor configured to extract the features of the object. The image processor is implemented in the one or more second semiconductor substrates.

In some aspects, the image processor is configured to provide pixel locations of the extracted features of the object in a first image frame to the controller. The controller is configured to: determine, based on the pixel locations of the extracted features, a region of interest (ROI) in a second image frame containing the second image data; and generate the programming signals based on the ROI.

In some aspects, the controller is configured to determine the ROI in the second image frame based on a motion model of the object.

In some aspects, the programming signals comprise a first subset of programming signals targeted at a first subset of the array of pixel cells within the ROI and a second subset of programming signals targeted at a second subset of the array of pixel cells.

In some aspects, the controller is configured to control all pixel cells of the array of pixel cells to output pixel data for the first image frame. The first subset of programming signals control the first subset of the array of pixel cells to output pixel data for the second image frame. The second subset of programming signals control the second subset of the array of pixel cells not to output pixel data for the second image frame.

In some aspects, the first subset of programming signals control at least one of: a first power consumed by the first subset of the array of pixel cells, a first quantization resolution of first pixel data output by the first subset of the array of pixel cells, or a first bit length of the first pixel data. The second subset of programming signals control at least one of: a second power consumed by the second subset of the array of pixel cells, a second quantization resolution of second pixel data output by the second subset of the array of pixel cells, or a second bit length of the first pixel data.

In some aspects, each pixel cell of the array pixel cell is individually addressable. The programming signals comprise pixel-level signals individually targeted at each pixel cell.

In some aspects, the controller is configured to: receive an indication from the image processor that the first image data does not contain the features of the object; and based on the indication, generate the programming signals to control the image sensor to perform a sub-sampling operation based on at least one of: disabling a subset of the array of pixel cells, or controlling the subset of the array of pixel cells not to output pixel data.

In some aspects, the controller is configured to generate the programming signals to scale a supply voltage of the image sensor.

In some aspects, the image processor is configured to: receive, from a second sensor, position information indicating a physical position of the object; and extract the features of the object from the first image data based on the position information.

In some aspects, the image processor implements a neural network to extract the features of the object.

In some aspects, weights of the neural network are obtained when the apparatus operates in a training mode and obtains image data of the object.

In some aspects, the programming signals are first programming signals. The image processor comprises a plurality of sub-blocks, each sub-block configured to extract the features of the object from a block of image data from the image sensor. The controller is configured to transmit second programming signals to the image processor to disable a subset of the sub-blocks for the extraction of the features of the object from the second image data based on a result of extraction of the features of the object from the first image data by the image processor.

In some aspects, the programming signals are first programming signals. The controller is configured to transmit second programming signals to the image processor to adjust at least one of: a supply voltage of the image processor, or an operation frequency of the image processor.

In some aspects, the programming signals are first programming signals. The controller is configured to transmit second programming signals to the image processor to control the image processor not to extract the features of the object from the second image data and to forward the second image data to an external system.

In some aspects, the apparatus further includes: pixel interconnects implemented by chip-to-chip copper bonding between the first semiconductor substrate and the one or more second semiconductor substrates to transmit signals generated by the photodiodes in the first semiconductor substrate to the circuits of the each pixel cell in the one or more second semiconductor substrates; and through silicon vias (TSV) between to transmit the first semiconductor substrate and the one or more second semiconductor substrates to transmit the programming signals from the controller to the image sensor.

In some examples, a method is provided. The method comprises: determining, by a controller, whether first image data generated by an image sensor contain features of an object, wherein the image sensor and the controller forms a stack and are housed within a semiconductor package; based on whether the first image data contain features of the object, generating, by the controller, programming signals for the image sensor; and controlling, by the controller and based on the programming signals, the image sensor to generate second image data.

In some aspects, the method further comprises extracting, by an image processor, the features of the object. The image processor is part of the stack and housed within the semiconductor package.

In some aspects, the method further comprises: determining, by the image processor, pixel locations of the extracted features of the object in a first image frame; determining, by the controller and based on the pixel locations of the extracted features, a region of interest (ROI) in a second image frame containing the second image data; and generating, by the controller, the programming signals based on the ROI.

BRIEF DESCRIPTION OF THE DRAWINGS

Illustrative embodiments are described with reference to the following figures.

Figure 1A:
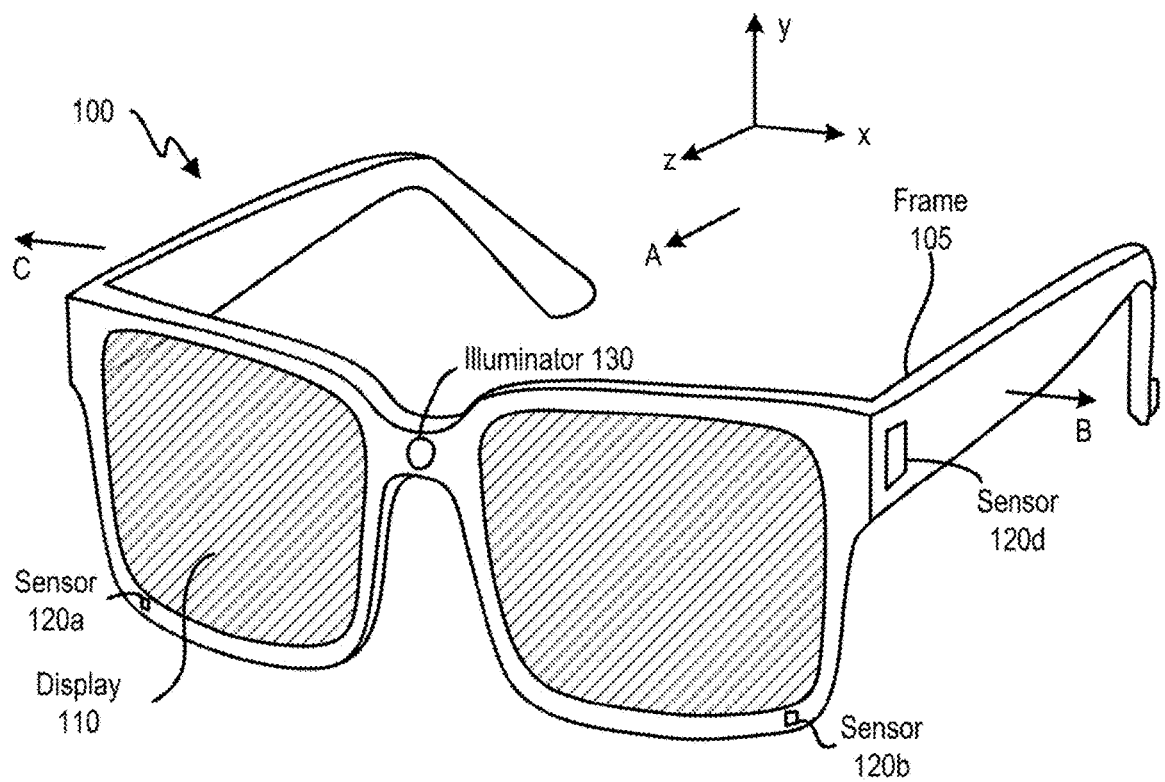
FIG. 1A and FIG. 1B are diagrams of an embodiment of a near-eye display.
Figure 1A:
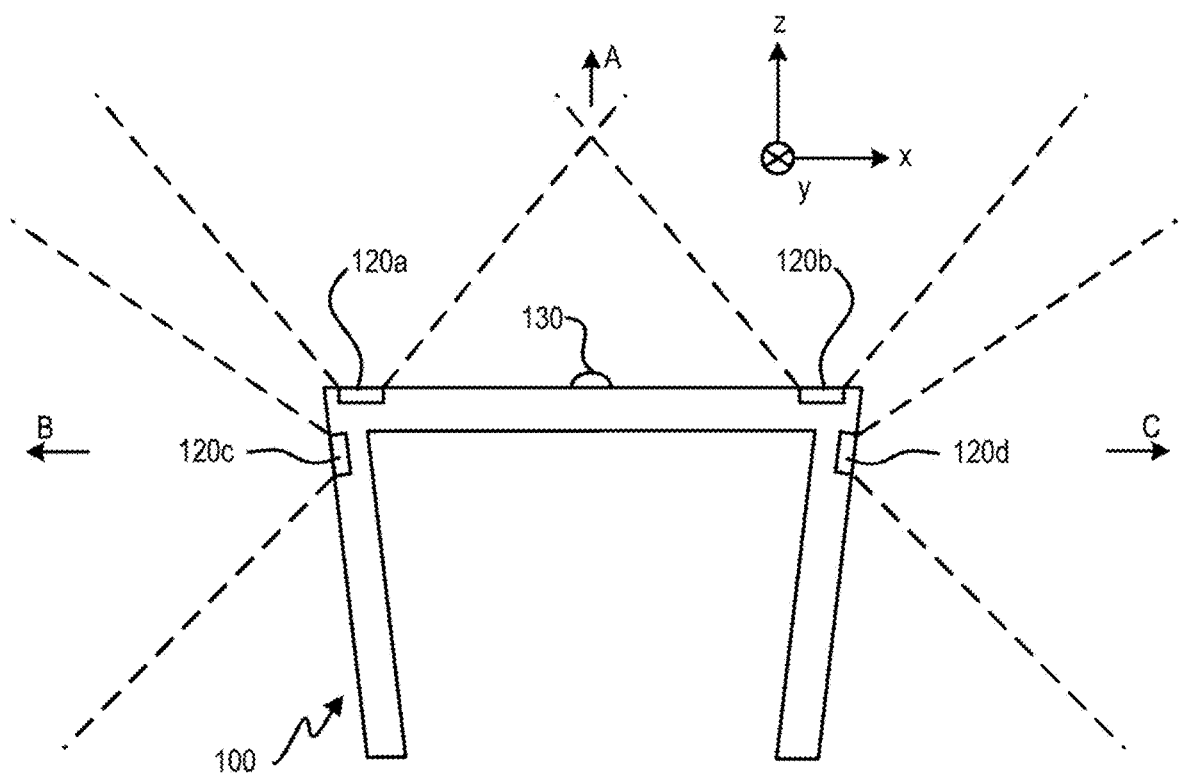

The figures depict embodiments of the present disclosure for purposes of illustration only. One skilled in the art will readily recognize from the following description that alternative embodiments of the structures and methods illustrated may be employed without departing from the principles of, or benefits touted in, this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

An image sensor includes an array of pixel cells. Each pixel cell includes circuit components to perform a light sensing operation. For example, each pixel cell may include a photodiode to sense incident light by converting photons into charge (e.g., electrons or holes) and a charge sensing unit (e.g., a floating drain and a buffer) to convert the charge into a voltage. The image sensor may also include one or more analog-to-digital converters (ADCs) to quantize the voltages output by the charge sensing units of the pixel cells into digital values. The ADC can quantize the charge by, for example, using a comparator to compare a voltage representing the charge with one or more quantization levels, and a digital value can be generated based on the comparison result. The digital values can then be stored in a memory to generate the image. An image sensor typically includes a controller to send out one or more chip-level programming signals to configure the operations of the pixel cells of the image sensor. For example, the controller can turn on or off all the pixel cells of the image sensor, set a global exposure time in which the pixel cells perform light sensing operations, etc.

The pixel data from an image sensor can support various applications, such as fusion of 2D and 3D sensing, object recognition and tracking, location tracking, etc. These applications can extract features of one or more objects from the image, and perform computations based on the extracted features. For example, to perform 3D sensing, an application can identify pixels of reflected structured light (e.g., dots), compare a pattern extracted from the pixels with the transmitted structured light, and perform depth computation based on the comparison. The application can also identify 2D pixel data from the same pixel cells that provide the extracted pattern of structured light to perform fusion of 2D and 3D sensing. To perform object recognition and tracking, an application can also identify pixels of image features of the object, extract the image features from the pixels, and perform the recognition and tracking based on the extraction results. The object recognition and tracking results can support higher level applications, such as a simultaneous localization and mapping (SLAM) application, an eye tracking application, etc. These applications are typically executed on a host processor, which can be electrically connected with the image sensor and receive the pixel data via interconnects. The host processor, the image sensor, and the interconnects can be part of an imaging system of a mobile device.

While these host applications can benefit from the image data generated by the array of pixel cells, the performance of the overall imaging system, such as power consumption, speed, accuracy, etc., can be limited by various factors. First, typically those applications have no control over the generation of the image data as well as the light sensing operations of these pixel cells. The lack of input from the host applications on the configuration of the pixel cells can impose limits on the achievable performance of the image sensor and these applications. For example, the host applications can benefit from high-resolution images and/or high frame rates. Higher-resolution images allow the application to extract more detailed features/patterns (e.g., more refined patterns of reflected structured light, more detailed image features, etc.), whereas providing images generated at a higher frame rate enables an application to track the location of an object, the location of the mobile device, etc., at a higher sampling rate, both processes of which can improve the performances of the applications. However, high-resolution images and high frame rates can lead to generation, transmission, and processing of a large volume of pixel data, which can present numerous challenges. For example, transmitting and processing a large volume of pixel data at a high data rate can lead to high power consumption at the image sensor, the interconnect, and the host processor. Moreover, the image sensor and the host processor may impose bandwidth limitations on and add latency to the generation and processing of large volumes of pixel data. The high power and high bandwidth requirement can be especially problematic for a mobile device which tends to operate with relatively low power and at a relatively low speed due to form factor and safety considerations.

In addition, typically the image sensor and the host processor are designed and optimized individually according to different specifications. Such arrangements can lead to inefficiency and waste of resources (e.g., power, bandwidth, etc.) at the image sensor and at the host processor when they are combined to form the imaging system. For example, the image sensor may be configured to generate pixel data from each pixel cell and transmit the pixel data to the host processor, but the host processor does not need pixel data from each pixel cell and only need pixel data from a subset of the pixel cells to track an object. As another example, the image sensor may be configured to output high precision pixel data at a high frame rate, both of which are beyond the processing capability of the host processor. As a result, the host processor only processes a few most significant bits (MSBs) of the pixel data from each pixel cell, and needs to skip frames. All these lead to waste of power and bandwidth at the image sensor in generating pixel data which cannot be processed by the host processor, while the overall system performances (e.g., frame rate, accuracy, etc.) are limited by the host processor.

This disclosure relates to an imaging system that can address at least some of the issues above. Specifically, the image system can include an image sensor, an image processor, and a controller. The image sensor includes an array of pixel cells configured to generate first image data. The image processor can process the first image data based on extracting features of an object and generate an output indicating whether the features of the object is in the first image data and if they are, pixel locations of the features in the first image data. The controller can determine, based on the output of the image processor, whether the first image data contain the features of the object, and generate programming signals for the image sensor based on the determination. The controller can then control the image sensor to generate second image data based on the programming signals. The image sensor can be implemented on a first semiconductor substrate, whereas the image processor and the controller can be implemented on one or more second semiconductor substrates, with the first semiconductor substrate and the one or more second semiconductor substrates forming a stack and housed within a semiconductor package. In some examples, the image processor and the controller can be part of a single compute block implemented on a single semiconductor substrate, while in other examples, the image processor and the controller can be separate processing circuit blocks implemented on different semiconductor substrates. The image sensor, the image processor, and the controller can be electrically connected using vertical electrical connections, such as through-silicon vias (TSV), chip-to-chip copper bonding, etc.

In some examples, the image sensor, the image processor, and the controller can form a closed loop system to dynamically program the image sensor based on the image data generated by the image sensor. Specifically, in a case where the image processor outputs the locations of the features of the object to the controller in a first image frame containing the first image data, the controller can determine a region of interest (ROI) in a second image frame to be generated by the image sensor. The controller can determine the ROI based on, for example, a motion model of the object to predict the pixel locations of the object in the second image frame based on the pixel locations of the features of the object in the first image frame. The controller can then generate a first subset of the programming signals for a first subset of the array of pixel cells in the ROI and a second subset of the programming signals for a second subset of the array of pixel cells outside the ROI. The different subsets of the programming signals can configure the corresponding subsets of the array of pixel cells differently. For example, the first subset of the programming signals can power on the first subset of pixel cells and/or enable the outputting of pixel data by the first subset of pixel cells, whereas the second subset of the programming signals can power off the second subset of pixel cells and/or disable the outputting of pixel data by the second subset of pixel cells. As another example, the first subset of the programming signals can increase the quantization resolution, the bit lengths of pixel data, etc., with respect to the second subset of pixel cells by the second subset of the programming signals. In a case where each pixel cell includes multiple photodiodes configured to sense light of different frequency ranges, the image processor can extract features corresponding to different frequency ranges, and the controller can determine ROIs for the different frequency ranges and generate the programming signals based on the ROIs for the different frequency ranges.

On the other hand, in a case where the image processor outputs that the features of the object are not in the first frame, and/or that the pixel locations of the object remain static across a number of frames, the controller can generate programming signals to adjust various aspects of the operations at the image sensor. For example, the controller can control the image sensor to perform a sub-sampling operation (e.g., only a subset of pixel cells are turned on and/or are enabled to output pixel data), to reduce the frame rate of the image sensor, etc.

In some examples, each pixel cell, or each group of pixel cells (e.g., 2×2 pixel cells) in the pixel array is individually programmable. In both cases above, the programming signals can include pixel-level programming signals targeted at each individual pixel cell/pixel cell group, to provide fine-grained control of the image sensor. Moreover, the image processor can extract features and update the pixel locations of the features from each image frame, which allows the controller to dynamically update the programming signals for the generation of each frame to reflect, for example, the detection/non-detection of features of the object, the updated locations of the ROI, etc.

The image processor can employ various techniques to extract features of an object. For example, the image processor may implement a neural network, such as convolution neural network (CNN), to perform arithmetic operations on the pixel data with weights to perform the extraction. The image processor may include memory devices (e.g., spin tunneling random access memory (STRAM), non-volatile random access memory (NVRAM), etc.) to store the weights. The image processor may receive the weights offline, and/or generate the weights based on a training process, or a combination of both. For example, in a case where the image processor is to extract features of an eye of the user, the image processor can obtain a set of initial weights offline. The image processor can then update the initial weights in a training mode where the image sensor captures images of the eye when the user is asked to look at a specific object at a specific physical location, and the image processor updates the initial weights so that features of the eyes can be extracted from pixel locations corresponding to the physical location. The image processor may also receive sensor data from other sensors, such as an inertial measurement unit (IMU), which can contain physical location information of the object, and perform extraction of the features of the object based on the sensor data.

In some examples, the controller can also control the feature extraction operations of the image processor. For example, based on an operation condition (e.g., a density of features of a scene, available power to the image system, a light condition, etc.), the controller can adjust the operating voltage of the image sensor, the speed at which the image processor extracts features of the object, etc. The controller can also provide the predicted location of ROI back to the image processor so that the image processor only extract features from the ROI in subsequent image frames. The controller can also disable part of the image processor to achieve a target efficiency based on, for example, a bit length of the pixel data output by the pixel cells. In a case where the controller determines that image processor cannot complete the extraction of the features (e.g., under a target power usage, at a required frame rate, etc.), the controller can also transmit at least part of the pixel data of the image sensor to an external system (e.g., a host) to perform the feature extraction. The controller can also transmit the extracted features to the host to support various host applications (e.g., eye tracking, SLAM, etc.).

With the disclosed techniques, an image sensor can be tightly integrated with the compute block comprising the image processor and the controller, which enable co-optimization of the image sensor and the compute block driven by a specific target (e.g., a target power, a target accuracy, a target speed, etc.). Such arrangement can improve the performance of the overall imaging system compared with a case where each component of the image system is optimized according to a different specification. For example, based on a power budget, the highest achievable pixel data precision can be determined while the total power spent by each of the image sensor and the compute block remains below the power budget. The image sensor and then compute block can then be configured to operate based on the target pixel data precision, to maximize the performance of the overall system while under the constraint of the power budget.

The tight integration of the image sensor and the compute block within a single semiconductor package can also provide various performance advantages. Specifically, the reliability and security of the image processing operation can be performed by consuming the image sensor data locally within the semiconductor package. In contrast, transmitting the image sensor data to an external chip (e.g., via wired or wireless data link) can expose the data to corruption and interception. Moreover, data privacy can be improved as well, since the storage of raw pixel data in an external memory can be avoided, as the raw image data is being consumed locally by the image processor. Further, local processing of the image data also reduces system latency and enables operation at higher speeds by, for example, reducing the volume of data that need to be transmitted on chip-to-chip interconnects which tend to be bandwidth limited. For example, the raw pixel data need not be transmitted off-chip to the host. Instead, the pixel data can be transmitted internally to the image processor for processing. Such arrangements can improve the performance of applications such as augmented reality (AR) applications, virtual reality (VR) applications, etc., for which latency is a critical metric, particularly with respect to sensing, tracking, and display systems. Further, power consumption can be reduced. Specifically, power consumption of data transfer can be directly related to the physical distance that data must be sent. For example, C-PHY Mobile Industry Processor Interface (MIPI) requires a few pico-Joule (pJ)/bit while wireless transmission through a 60GHz link requires a few hundred pJ/bit. Therefore, power consumption can be reduced by moving the pixel data transfer away from off-chip transfer (e.g., via C-PHY MIPI, wireless channels, etc.) to interconnects within the package. Similarly, a 32-bit on-chip SRAM memory access may consume roughly 100 times less energy than a 32-bit off-chip DRAM memory access. Thus, a tightly integrated system that incorporates both the sensing and computing blocks in the same package can lead to a much lower power consumption than a heterogeneous system in which the image sensor and the compute block are in two different packages connected by off-chip interconnects or wireless connections.

In addition, with the disclosed techniques, a closed loop feedback system can be implemented to dynamically configure the operations at the image sensor and/or at the image processor, which can further improve the overall performance of the imaging system. Specifically, the controller can program the pixel cells based on whether the pixel cells in an ROI. The controller can also program the pixel cells within the ROI to generate pixel data at a higher accuracy/higher speed to further improve the performance of the system. Furthermore, the controller can configure the image processor to extract features from the ROI of an image frame to improve efficiency and reduce system latency in feature extraction. All these can reduce the waste of resources (e.g., power, bandwidth, etc.) in generating, transmitting, and processing pixel data not needed by the host application, while allowing the resources to be used in improving the quality of the pixel data needed by the host application. Moreover, as the image sensor and the compute block are tightly integrated within a single semiconductor package, the feedback system can be operated at a high speed, and the updating of the programming signals can be more responsive to change in the operation condition of the imaging system. All these can improve the efficiency and overall performance of the imaging system, especially in capturing images of fast-changing scenes to support object tracking applications, SLAM applications, etc.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some embodiments, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
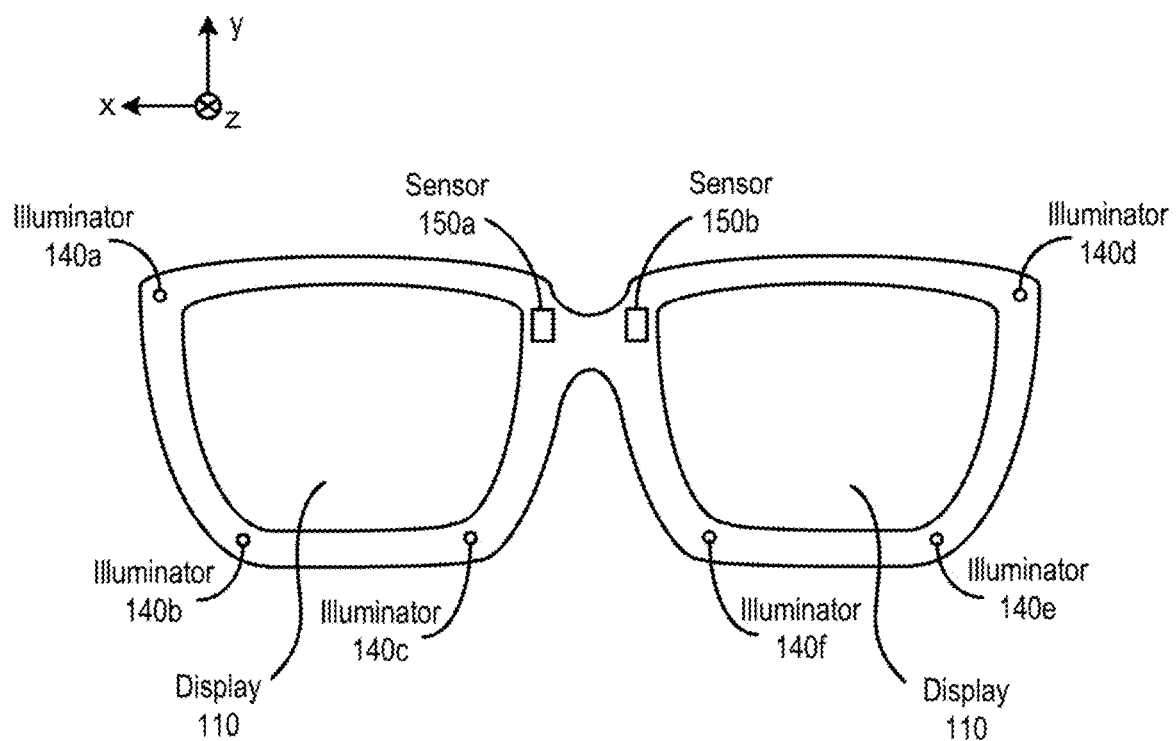
Figure 1B:
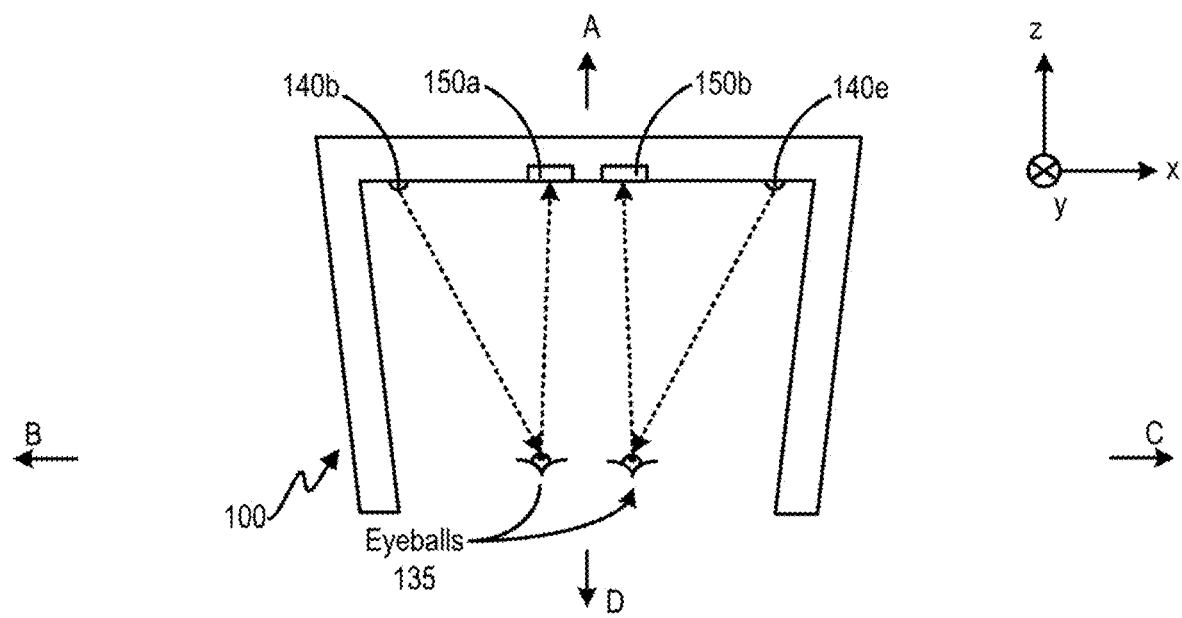

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 2:
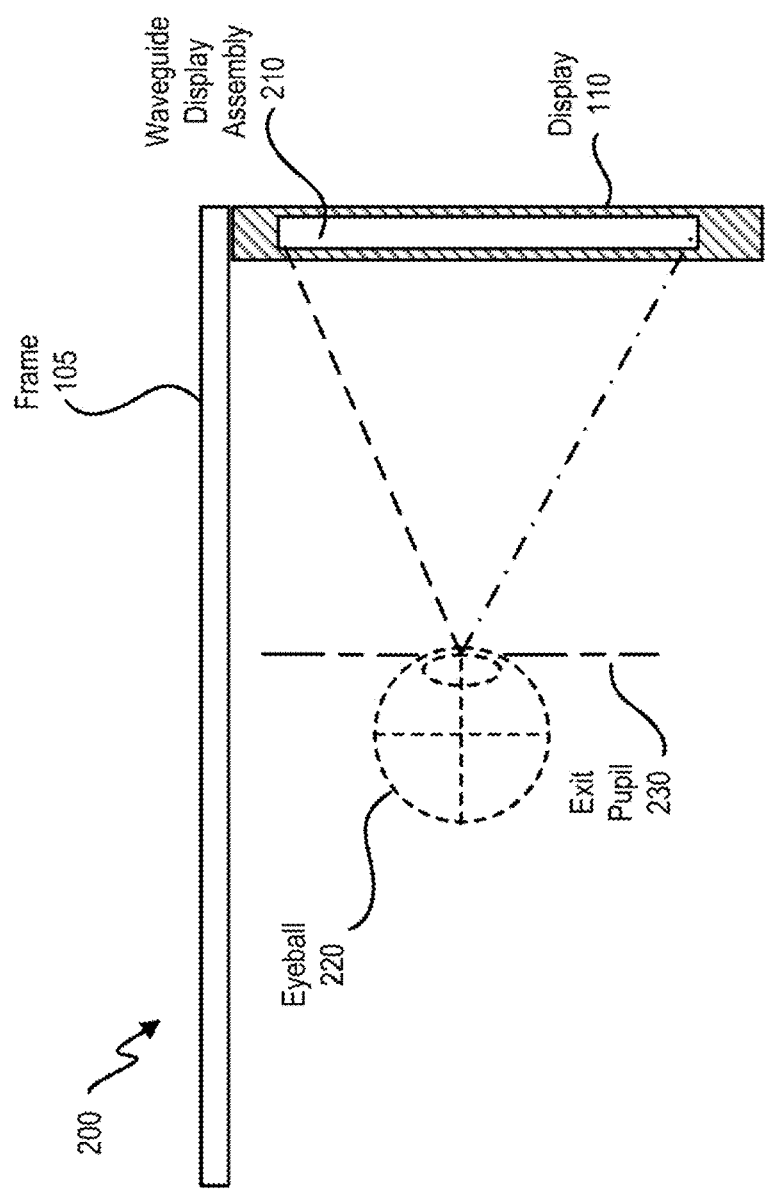
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
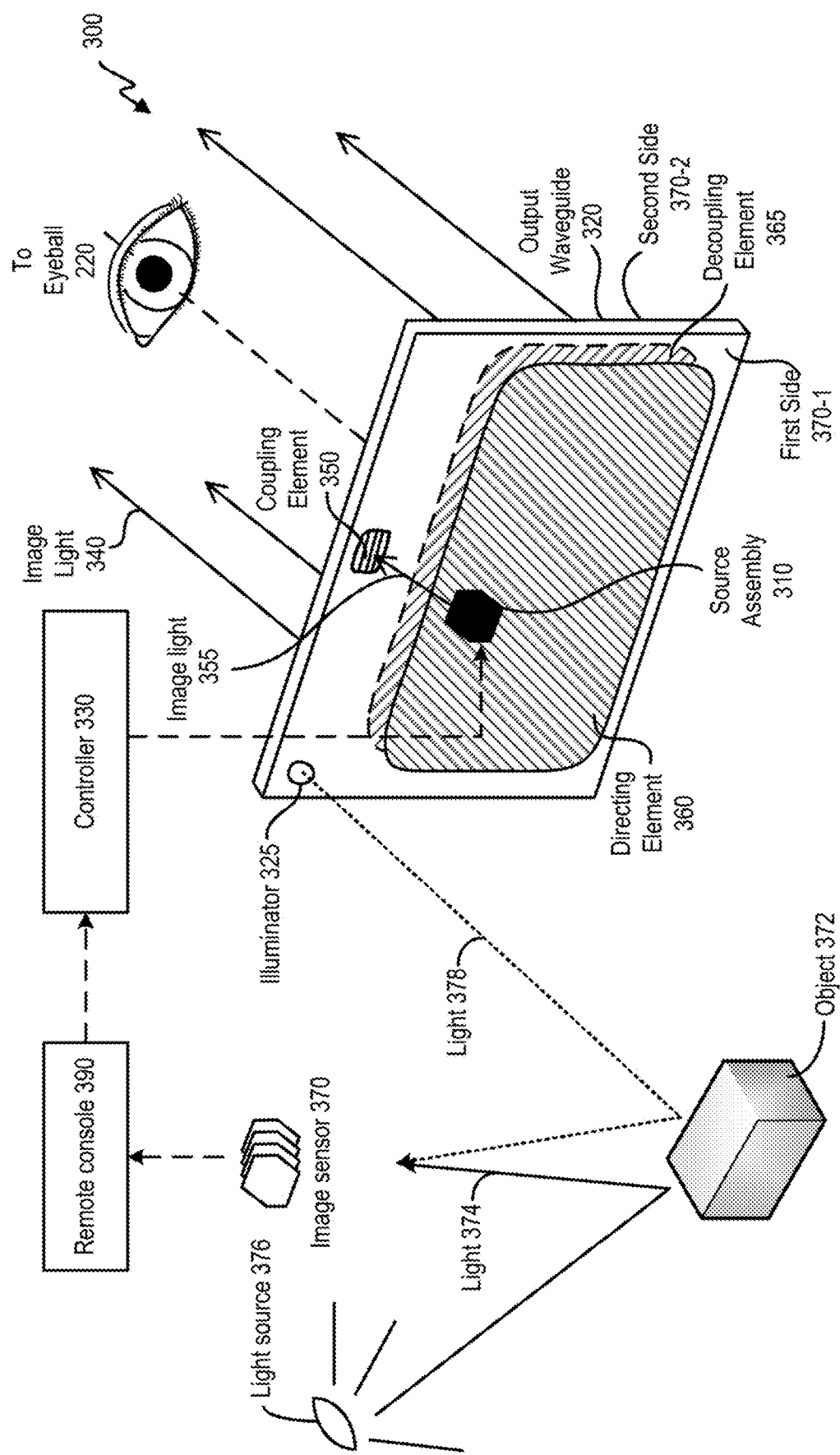
FIG. 3 illustrates an isometric view of an embodiment of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A. Image sensors 120a-120d can be operated to perform 2D sensing and 3D sensing of, for example, an object 372 in front of the user (e.g., facing first side 370-1). For 2D sensing, each pixel cell of image sensors 120a-120d can be operated to generate pixel data representing an intensity of light 374 generated by a light source 376 and reflected off object 372. For 3D sensing, each pixel cell of image sensors 120a-120d can be operated to generate pixel data representing a time-of-flight measurement for light 378 generated by illuminator 325. For example, each pixel cell of image sensors 120a-120d can determine a first time when illuminator 325 is enabled to project light 378 and a second time when the pixel cell detects light 378 reflected off object 372. The difference between the first time and the second time can indicate the time-of-flight of light 378 between image sensors 120a-120d and object 372, and the time-of-flight information can be used to determine a distance between image sensors 120a-120d and object 372. Image sensors 120a-120d can be operated to perform 2D and 3D sensing at different times, and provide the 2D and 3D image data to a remote console 390 that may be (or may be not) located within waveguide display 300. The remote console may combine the 2D and 3D images to, for example, generate a 3D model of the environment in which the user is located, to track a location and/or orientation of the user, etc. The remote console may determine the content of the images to be displayed to the user based on the information derived from the 2D and 3D images. The remote console can transmit instructions to controller 330 related to the determined content. Based on the instructions, controller 330 can control the generation and outputting of image light 355 by source assembly 310, to provide an interactive experience to the user.

Figure 4:
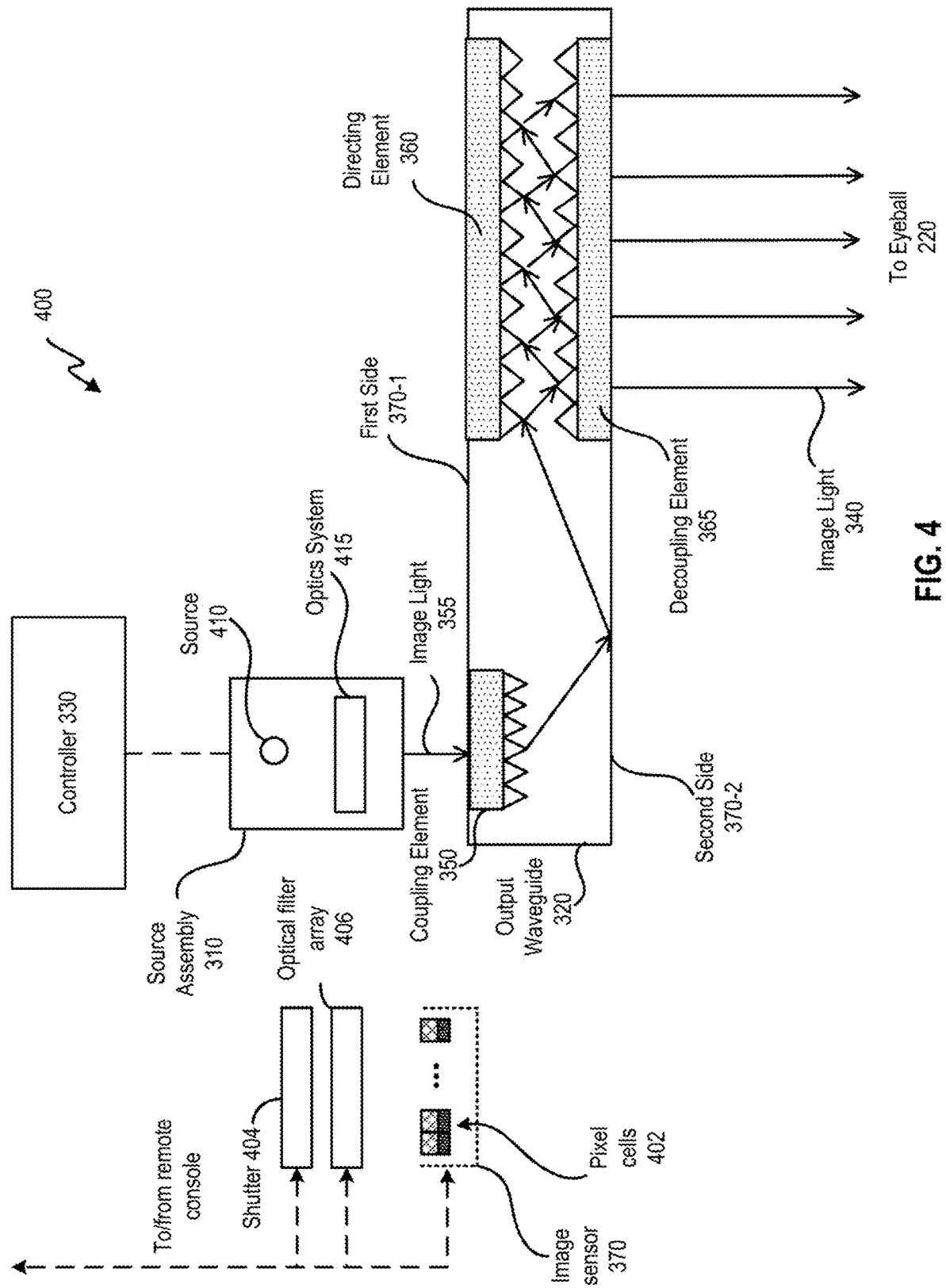
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 and an optical filter array 406 interposed between the set of pixel cells 402 and the physical environment. Mechanical shutter 404 can control the exposure of the set of pixel cells 402. In some embodiments, the mechanical shutter 404 can be replaced by an electronic shutter gate, as to be discussed below. Optical filter array 406 can control an optical wavelength range of light the set of pixel cells 402 is exposed to, as to be discussed below. Each of pixel cells 402 may correspond to one pixel of the image. Although not shown in FIG. 4, it is understood that each of pixel cells 402 may also be overlaid with a filter to control the optical wavelength range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is a diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
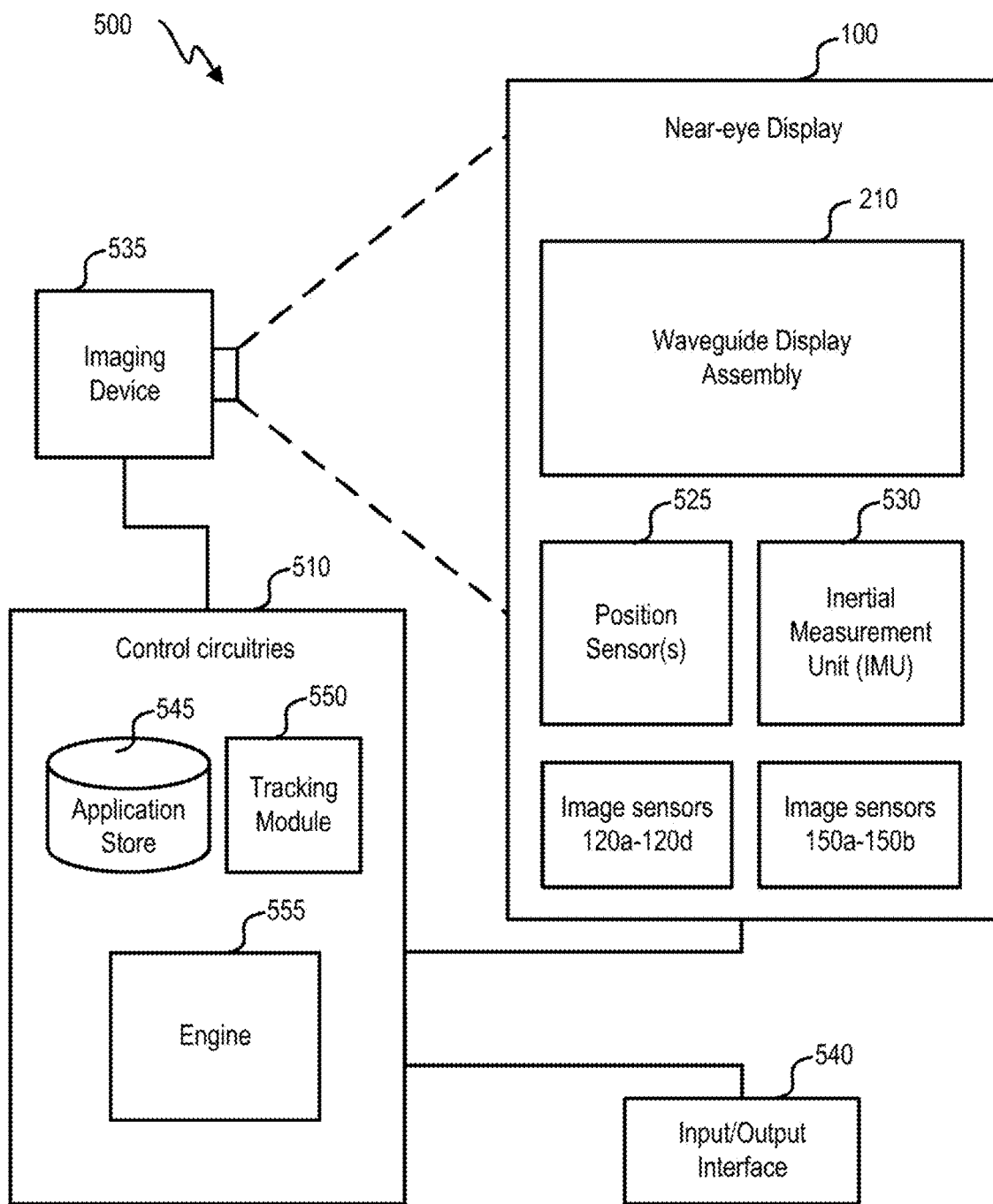
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a mobile device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120*a*-120*d* of FIG. 1A for generating image data of a physical environment in which the user is located, for performing location tracking of the user. Imaging device 535 may further include, for example, image sensors 150*a*-150*b* of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6A:
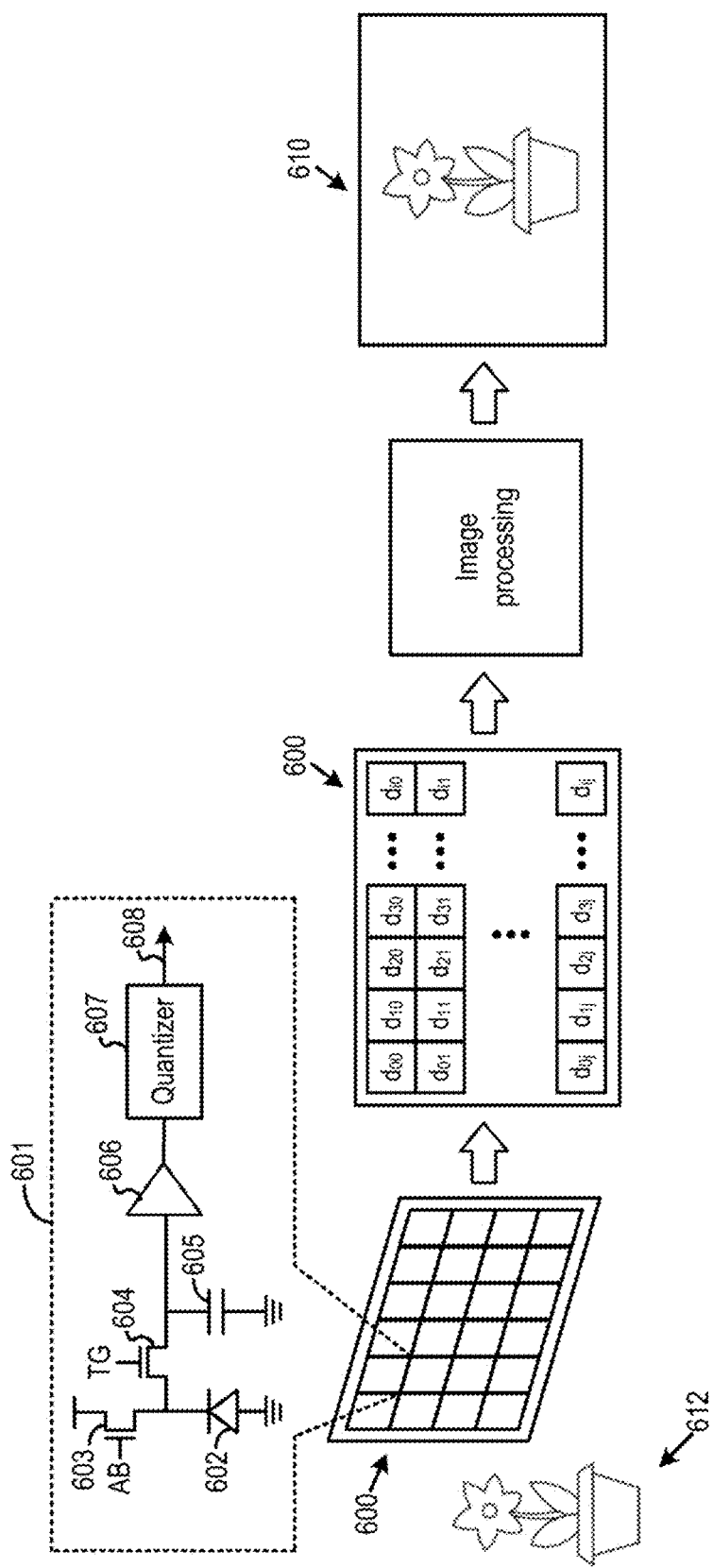
FIG. 6A, FIG. 6B, FIG. 6C, and FIG. 6D illustrate examples of an image sensor and its operations.

FIG. 6A, FIG. 6B, FIG. 6C, and FIG. 6D illustrate examples of an image sensor 600 and its operations. As shown in FIG. 6A, image sensor 600 can include an array of pixel cells, including pixel cell 601, and can generate digital intensity data corresponding to pixels of an image. Pixel cell 601 may be part of pixel cells 402 of FIG. 4. As shown in FIG. 6A, pixel cell 601 may include a photodiode 602, an electronic shutter switch 603, a transfer switch 604, a charge storage device 605, a buffer 606, and a quantizer 607. Photodiode 602 may include, for example, a P-N diode, a P-I-N diode, a pinned diode, etc., whereas charge storage device 605 can be a floating drain node of transfer switch 604. Photodiode 602 can generate and accumulate residual charge upon receiving light within an exposure period. Upon saturation by the residual charge within the exposure period, photodiode 602 can output overflow charge to charge storage device 605 via transfer switch 604. Charge storage device 605 can convert the overflow charge to a voltage, which can be buffered by buffer 606. The buffered voltage can be quantized by quantizer 607 to generate measurement data 608 to represent, for example, the intensity of light received by photodiode 602 within the exposure period.

Quantizer 607 may include a comparator to compare the buffered voltage with different thresholds for different quantization operations associated with different intensity ranges. For example, for a high intensity range where the quantity of overflow charge generated by photodiode 602 exceeds a saturation limit of charge storage device 605, quantizer 607 can perform a time-to-saturation (TTS) measurement operation by detecting whether the buffered voltage exceeds a static threshold representing the saturation limit, and if does, measuring the time it takes for the buffered voltage to exceed the static threshold. The measured time can be inversely proportional to the light intensity. Also, for a medium intensity range in which the photodiode is saturated by the residual charge but the overflow charge remains below the saturation limit of charge storage device 605, quantizer 607 can perform a FD ADC operation to measure a quantity of the overflow charge stored in charge storage device 605. Further, for a low intensity range in which the photodiode is not saturated by the residual charge and no overflow charge is accumulated in charge storage device 605, quantizer 607 can perform a PD ADC operation to measure a quantity of the residual charge accumulated in photodiode 602. The output of one of TTS, FD ADC, or PD ADC operation can be output as measurement data 608 to represent the intensity of light.

Figure 6B:
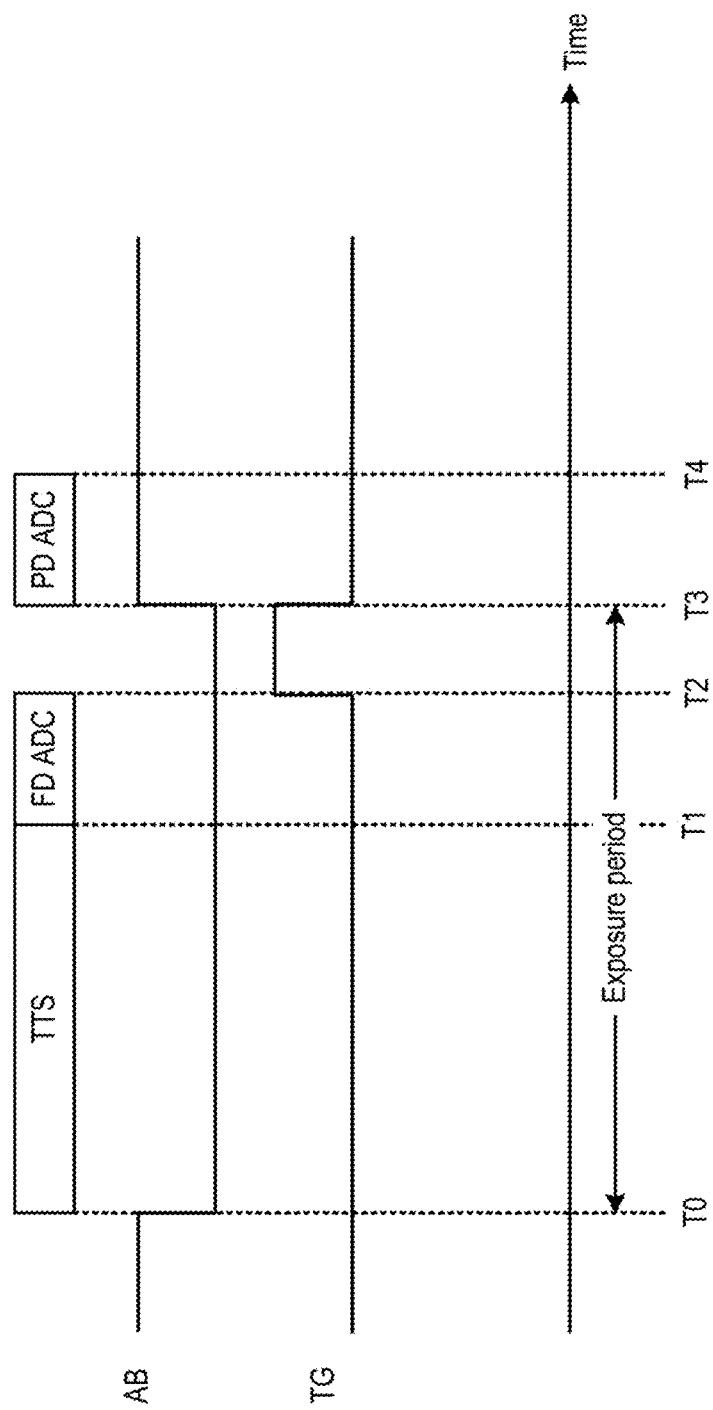
Figure 6C:
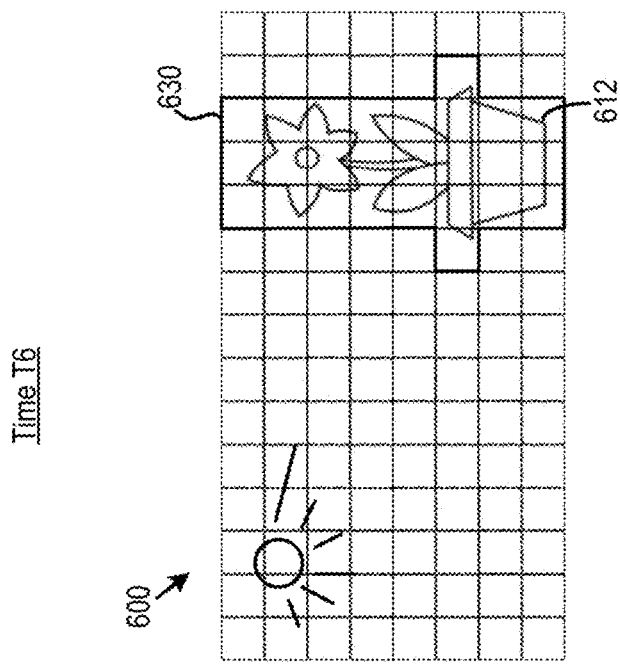
Figure 6C:
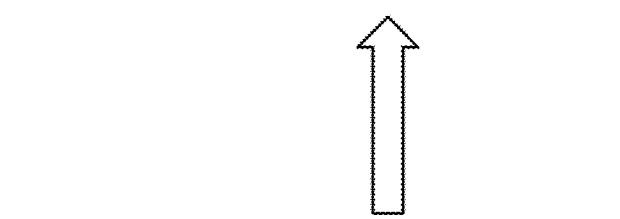
Figure 6C:
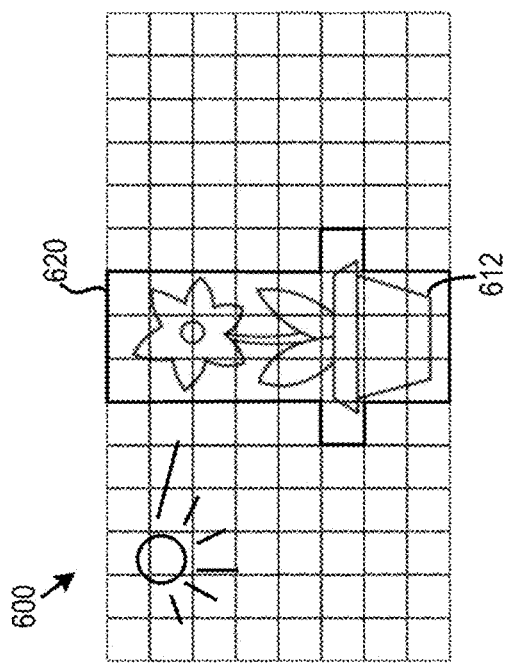
Figure 6D:
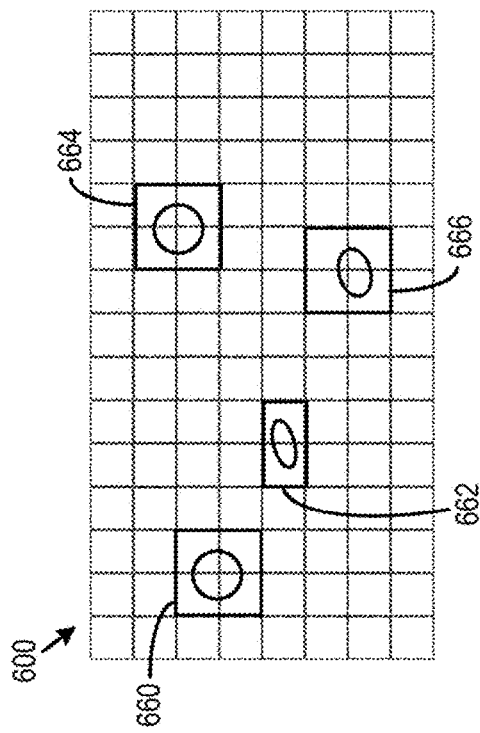
Figure 6D:
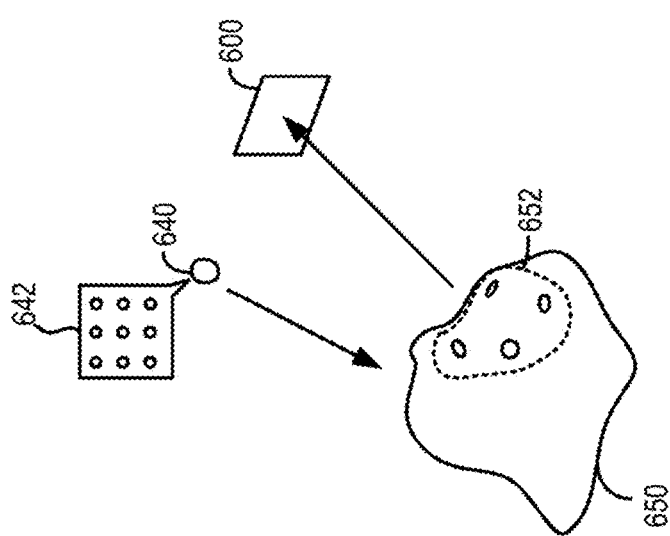

FIG. 6B illustrates an example sequence of operations of pixel cell 601. As shown in FIG. 6B, the exposure period can be defined based on the timing of AB signal controlling electronic shutter switch 603, which can steer the charge generated by photodiode 602 away when enabled, and based on the timing of the TG signal controlling transfer switch 604, which be controlled to transfer the overflow charge and then the residual charge to charge storage device 605 for read out. For example, referring to FIG. 6B, the AB signal can be de-asserted at time T0 to allow photodiode 602 to generate charge. T0 can mark the start of the exposure period. Within the exposure period, the TG signal can set transfer switch 604 at a partially-on state to allow photodiode 602 to accumulate at least some of the charge as residual charge until photodiode 602 saturates, after which overflow charge can be transferred to charge storage device 605. Between times T0 and T1, quantizer 607 can perform a TTS operation to determine whether the overflow charge at charge storage device 605 exceeds the saturation limit, and then between times T1 and T2, quantizer 607 can perform a FD ADC operation to measure a quantity of the overflow charge at charge storage device 605. Between times T2 and T3, the TG signal can be asserted to bias transfer switch 604 in a fully-on state to transfer the residual charge to charge storage device 605. At time T3, the TG signal can be de-asserted to isolate charge storage device 605 from photodiode 602, whereas the AB signal can be asserted to steer charge generated by photodiode 602 away. The time T3 can mark the end of the exposure period. Between times T3 and T4, quantizer 607 can perform a PD operation to measure a quantity of the residual charge.

The AB and TG signals can be generated by a controller (not shown in FIG. 6A) which can be part of pixel cell 601 to control the duration of the exposure period and the sequence of quantization operations. The controller can also detect whether charge storage device 605 is saturated and whether photodiode 602 is saturated to select the outputs from one of the TTS, FD ADC, or PD ADC operations as measurement data 608. For example, if charge storage device 605 is saturated, the controller can provide the TTS output as measurement data 608. If charge storage device 605 is not saturated but photodiode 602 is saturated, the controller can provide the FD ADC output as measurement data 608. If photodiode 602 is not saturated, the controller can provide the PD ADC output as measurement data 608. The measurement data 608 from each pixel cells of image sensor 600 generated within the exposure period can form an image frame. The controller can repeat the sequence of operations in FIG. 6B in subsequent exposure periods to generate subsequent image frames.

The image frame data from image sensor 600 can be transmitted to a host processor (not shown in FIG. 6A-FIG. 6D) to support different applications, such as identifying and tracking object 612, performing depth sensing of object 612 with respect to image sensor 600, etc. For all these applications, only a subset of pixel cells provide relevant information (e.g., pixel data of object 612), whereas the reset of pixel cells do not provide relevant information. For example, referring to FIG. 6C, at time T0 a group of pixel cells 620 of image sensor 600 receive light reflected by object 612, whereas time T6, object 612 may have shifted (e.g., due to a movement of object 612, a movement of image sensor 600, or both), and a group of pixel cells 630 of image sensor 600 receive light reflected by object 612.

In some examples, image sensor 600 can transmit only the pixel data from group of pixel cells 620 and 630 to the host processor to reduce the volume of pixel data being transmitted. In some examples, image sensor 600 can also have all the pixels to transmit pixel data, but groups of pixel cells 620 and 630 can have different configurations as others. For example, groups of pixel cells 620 and 630 can generate and output the pixel data at a higher quantization resolution to represent the image of object 612, while the rest of the pixel cells can generate and output the pixel data at a lower resolution. As another example, groups of pixel cells 620 and 630 can have longer exposure periods than the others. All these arrangements can allow generation and transmission of higher resolution images without corresponding increase in power and bandwidth. For example, a larger pixel cell array including more pixel cells can be used to image object 612 to improve image resolution, while the bandwidth and power required to provide the improved image resolution can be reduced when only a subset of the pixel cells, including the pixel cells that provide pixel data of object 612, generate high resolution pixel data and transmit the high resolution pixel data to the host processor, while the rest of the pixel cells are either not generating/transmitting pixel data, or generating/transmitting pixel data at a very low resolution. Moreover, while image sensor 600 can be operated to generate images at a higher frame rate, the increases in bandwidth and power can be reduced when each image only includes a small set of pixel values that are at high resolution and represented by a large number of bits, while the rest of the pixel values are at very low resolution and are represented by a smaller number of bits.

The volume of pixel data transmission can also be reduced in the case of 3D sensing. For example, referring to FIG. 6D, an illuminator 640 can project a pattern 642 of structured light onto an object 650. The structured light can be reflected on a surface of an object 650, and a pattern 652 of reflected light can be captured by image sensor 600 to generate an image. Host processor can match pattern 652 with pattern 642 and determine the depth of object 650 with respect to image sensor 600 based on the image locations of pattern 652 in the image. For 3D sensing, only groups of pixel cells 660, 662, 664, and 666 contain relevant information (e.g., pixel data of pattern 652). To reduce the volume of pixel data being transmitted, image sensor 600 can be configured to send only the pixel data from groups of pixel cells 660, 662, 664, and 666, or to send the pixel data from groups of pixel cells 660, 662, 664, and 666 at a high resolution while the rest of the pixel data are at a low resolution, to the host processor.

Figure 7A:
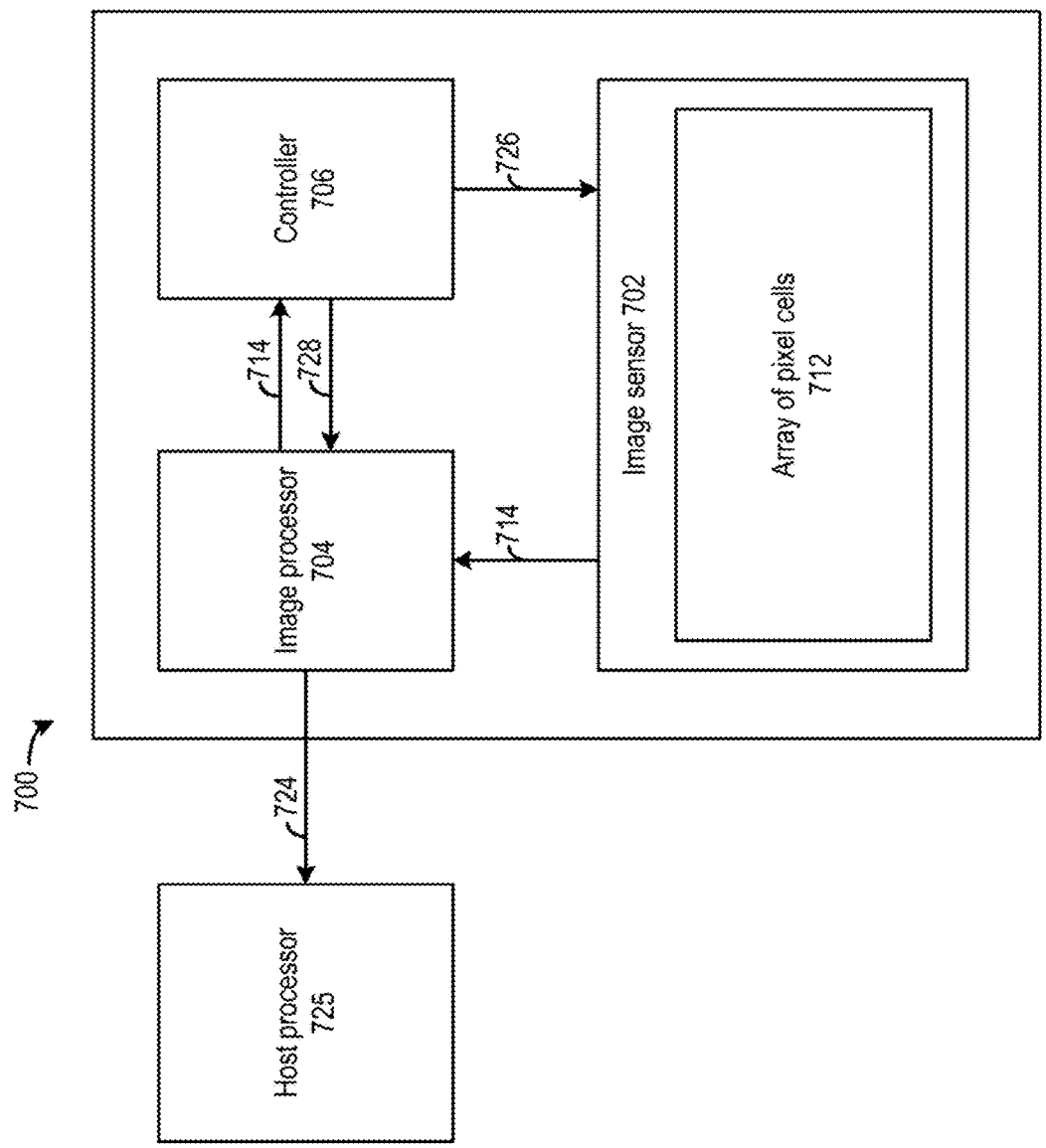
FIG. 7A, FIG. 7B, and FIG. 7C illustrate an example of an imaging system and its operations.
Figure 7B:
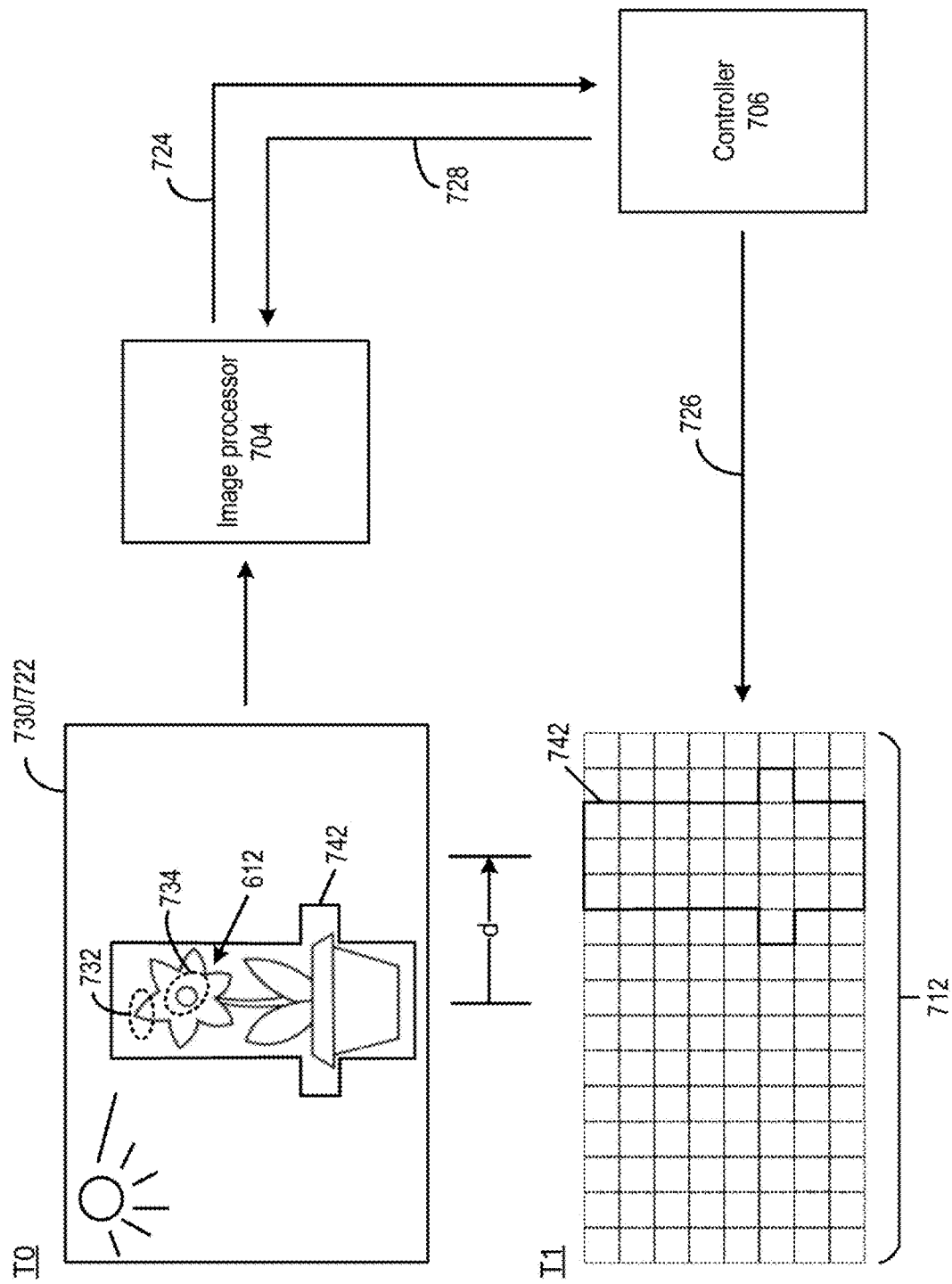
Figure 7C:
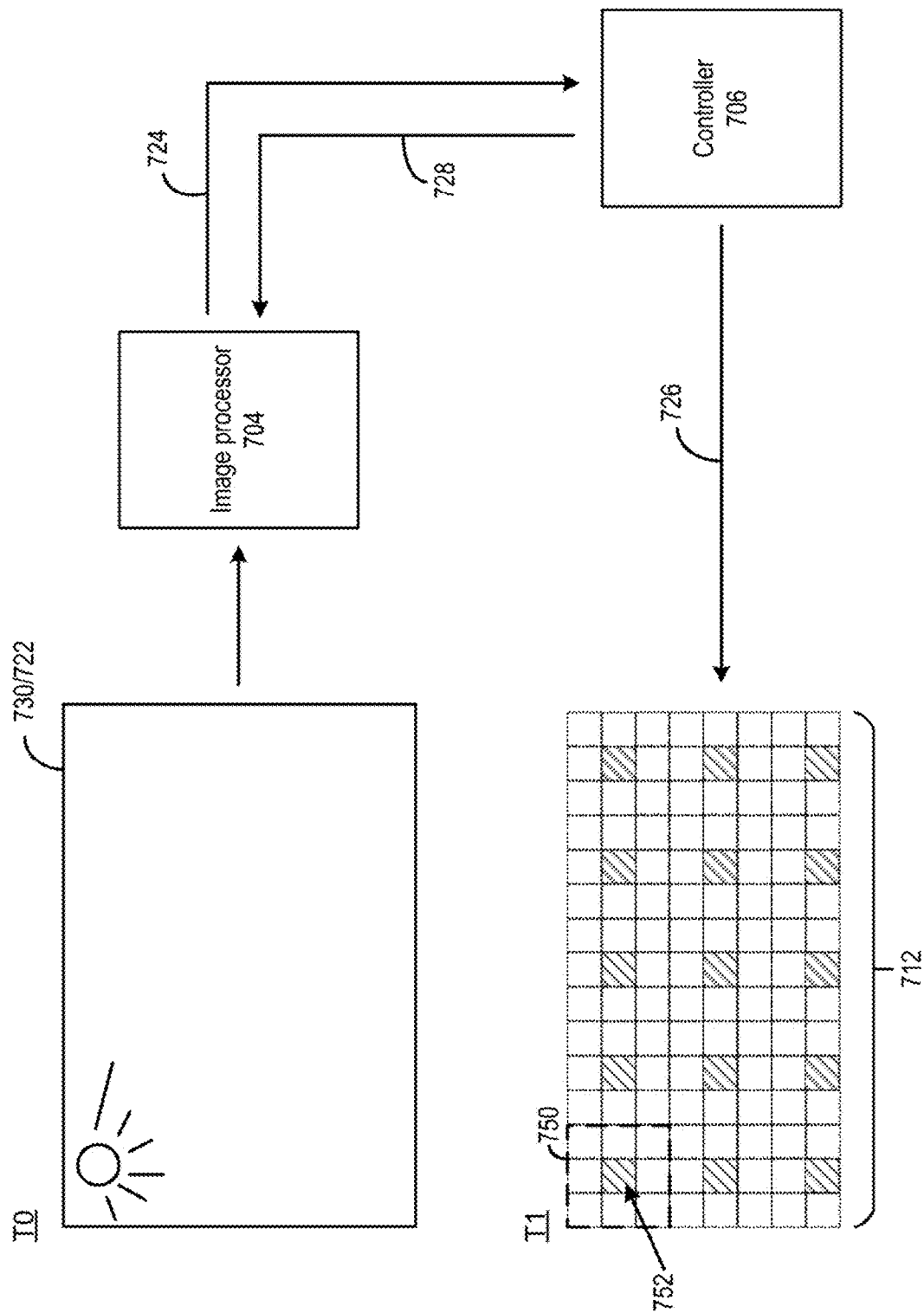

FIG. 7A, FIG. 7B, and FIG. 7C illustrate examples of an imaging system 700 and its operations. As shown in FIG. 7A, imaging system 700 includes an image sensor 702, an image processor 704, and a controller 706. Image sensor 702, image processor 704, and controller 706 can be part of a semiconductor chip and housed within a single semiconductor package. Image sensor 702 includes an array of pixel cells 712 to generate image data, such as image data 722. In some examples, each pixel cell of array of pixel cells 712 can include pixel cell 601 of FIG. 6A, and the image data may include, for example, pixel data representing an intensity of light received by each pixel cell. Image processor 704 can process image data 722 from image sensor 702 to extract features of a scene, such as object 612, pattern 652, etc., and generate an output 724 of the extracted features and their pixel locations in image data 722. Image processor 704 can transmit output 724 to an external system, such as a host processor 725, to support various applications operated on host processor 725, such as a SLAM application, an object tracking application, etc. Host processor 725 and imaging system 700 can be electrically connected via an interconnect (not shown in FIG. 7A), such as an interconnect compatible with the Mobile Industry Processor Interface (MIPI). In addition, controller 706 can generate programming signals 726 to control the light sensing and image data generation operations of image sensor 702. Controller 706 can also generate programming signals 728 to control the operations of image processor 704.

In some examples, image sensor 702, image processor 704, and controller 706 can form a closed loop system to dynamically determine programming signals 726 for image sensor 702 and/or programming signals 728 for image processor 704 based on the image data generated by the image sensor. FIG. 7B and FIG. 7C illustrate examples of a feedback operation by image sensor 702, image processor 704, and controller 706. As shown in FIG. 7B, image processor 704 can receive an image frame 730 from image sensor 702 as part image data 722 at time T0. From image frame 730, image processor 704 can extract features of the scene including, for example, edges 732, textures 734, etc. of object 612, as well as the pixel locations of the features in image frame 730, and include information identifying the features and their pixel locations in output 724. Based on the features and the pixel locations in output 724, controller 706 can determine whether object 612 is present in image frame 730. If object 612 is present in image frame 730, controller 706 can determine the pixel locations of pixels of object 612 in image frame 730, and a region of interest (ROI) 742 that encircles the pixels of object 612 in image frame 730. Controller 706 can also determine the location of ROI 742 in a subsequent image frame to be generated by array of pixel cells 712 at time T1. The determination can be based on predicting a distance of movement of object 612 (labelled "d" in FIG. 7B"), which can be based on, for example, a motion model of object 612 (e.g., based on a history of movement/pixel locations of object 612 captured in previous image frames), a time difference between the image frame 730 and the subsequent image, etc. Based on the location of ROI 742 in the subsequent image frame, controller 706 can identify a first subset of array of pixel cells 712 that are within ROI 742 at time T1, as well as a second subset of array of pixel cells 712 that are outside ROI 742 at time T1.

Controller 706 can generate programming signals 726 and/or 728 based on the identification of the first subset and second subset of array of pixel cells 712. For example, controller 706 can then generate a first subset of programming signals 726 for the first subset of the array of pixel cells in the ROI and a second subset of programming signals 726 for the second subset of the array of pixel cells outside the ROI. The different subsets of the programming signals can configure the corresponding subsets of the array of pixel cells differently. For example, the first subset of programming signals 726 can power on the first subset of pixel cells and/or enable the outputting of pixel data by the first subset of pixel cells, whereas the second subset of programming signals 726 can power off the second subset of pixel cells, and/or disable the outputting of pixel data by the second subset of pixel cells, to reduce the volume of pixel data output by array of pixel cells 712.

As another example, the second subset of programming signals 726 can allow the second subset of the array of pixel cells to generate and output pixel data, but the pixel data can be generated and output at a lower precision (e.g., at a lower quantization resolution, having a lower bit length, etc.) than the first subset of array of pixel cells 712. Such arrangement allows image processor 704 to extract features of the scene outside ROI 742 from the second subset of the array of pixel cells, and to provide the extracted features to controller 706, which allows controller 706 to confirm whether the predicted location of ROI 742 in the subsequent image frame is correct. Meanwhile, the first subset of programming signals 726 can also increase the precision of the generation of pixel data at the first subset of array of pixel cells 712, to improve the accuracy of extraction of features by image sensor 704 for object 612.

In some examples, each pixel cell of array of pixel cells 712 may include multiple photodiodes configured to sense light of different frequency ranges, and generate different image frames for different frequency ranges. For example, referring back to FIG. 7A and FIG. 7B, array of pixel cells 712 may generate an image frame including object 612 in the visible light frequency range for 2D sensing, and another image frame including pattern 652 in the infra-red frequency range for 3D sensing. In such a case, image processor 704 can extract features from each frame corresponding to different frequency ranges. Controller 706 can also determine ROIs for each of the different frequency ranges, and generate programming signals 726 based on the ROIs for the different frequency ranges. For example, controller 706 can generate a first set of programming signals 726 based on ROIs of object 612 for array of pixel cells 712 operating in 2D sensing mode, and a second set of programming signals 726 based on ROIs of pattern 652 for array of pixel cells 712 operating in 3D sensing mode.

In some examples, as part of the feedback operation, controller 706 can also generate programming signals 728 based on the ROI determination to control the feature extraction operations at image processor 704, which can reduce latency and power incurred by the feature extraction operations. For example, controller 706 can also provide the predicted location of ROI 742 back to image processor 704 as part of programming signals 728 so that image processor 704 only extract features from the ROI in the subsequent image frame output by array of pixel cells 712 at time T1, and not to perform feature extraction operation at other pixel locations of the image frame. As another example, in a case where image processor 704 include computation sub-blocks to process pixel data from each pixel cell in parallel, controller 706 can also disable the computation sub-blocks assigned to pixel cells outside ROI 742, or otherwise configure those sub-blocks to operate at a lower power (e.g., perform the computations at a lower operation frequency, at a lower precision, scale down the supply voltage to those sub-blocks, etc.) to reduce total power consumed by the feature extraction operation.

FIG. 7C illustrate another feedback operation by image sensor 702, image processor 704, and controller 706. In FIG. 7C, controller 706 may determine that image frame 730 at time T0 does not contain the features of object 612, or that object 612 has been static in the prior image frames. Based on such determination, controller 706 can generate programming signals 726 to adjust various aspects of the operations at array of pixel cells 712. For example, as shown in FIG. 7C, controller 706 can control array of pixel cells 712 to perform a sub-sampling operation, in which array of pixel cells 712 is divided into sampling groups (e.g., group 750) each including multiple pixel cells, and from each group only one pixel cell (e.g., pixel cell 752) is enabled or allowed to transmit pixel data for the subsequent frame at time T1. As another example, controller 706 can control array of pixel cells 712 to generate pixel data at a lower frame rate. Controller 706 can also generate programming signals 728 to adjust the operation of image processor 704 accordingly. For example, in a case where array of pixel cells 712 performs a sub-sampling operation, controller 706 can control image processor 704 to process pixel data from one pixel cell from each sampling group. As another example, in a case where the frame rate is reduced, controller 706 can also reduce the operating frequency of image processor 704 according to reduced frame rate.

In addition to the feedback operations described in FIG. 7B and FIG. 7C, imaging system 700 can also support other feedback operations based on, for example, inputs from the host processor 725. For example, host processor 725 can provide information of an operation condition to controller 706. The operation condition may include, for example, a density of features of a scene to be imaged, available power to the imaging system, a light condition, etc. Based on the operation condition, controller 706 can adjust programming signals 726 for array of pixel cells 712 and/or programming signals 728 for image processor 704. For example, in a case where the available power to the imaging system is reduced (e.g., due to low battery), controller 706 can adjust programming signals 726 and/or programming signals 728 to scale down the voltage supply at, respectively, image sensor 702 and image processor 704. As another example, in a case where the image system operates in a low light environment, controller 706 can adjust programming signals 726 to, for example, increase the exposure period of array of pixel cells 712, control each pixel cell to only use a particular quantization operation (e.g., PD ADC) to generate pixel data, etc. Controller 706 can also adjust programming signals 728 to configure image processor 704 to perform extraction operations based on the low light condition.

Figure 8A:
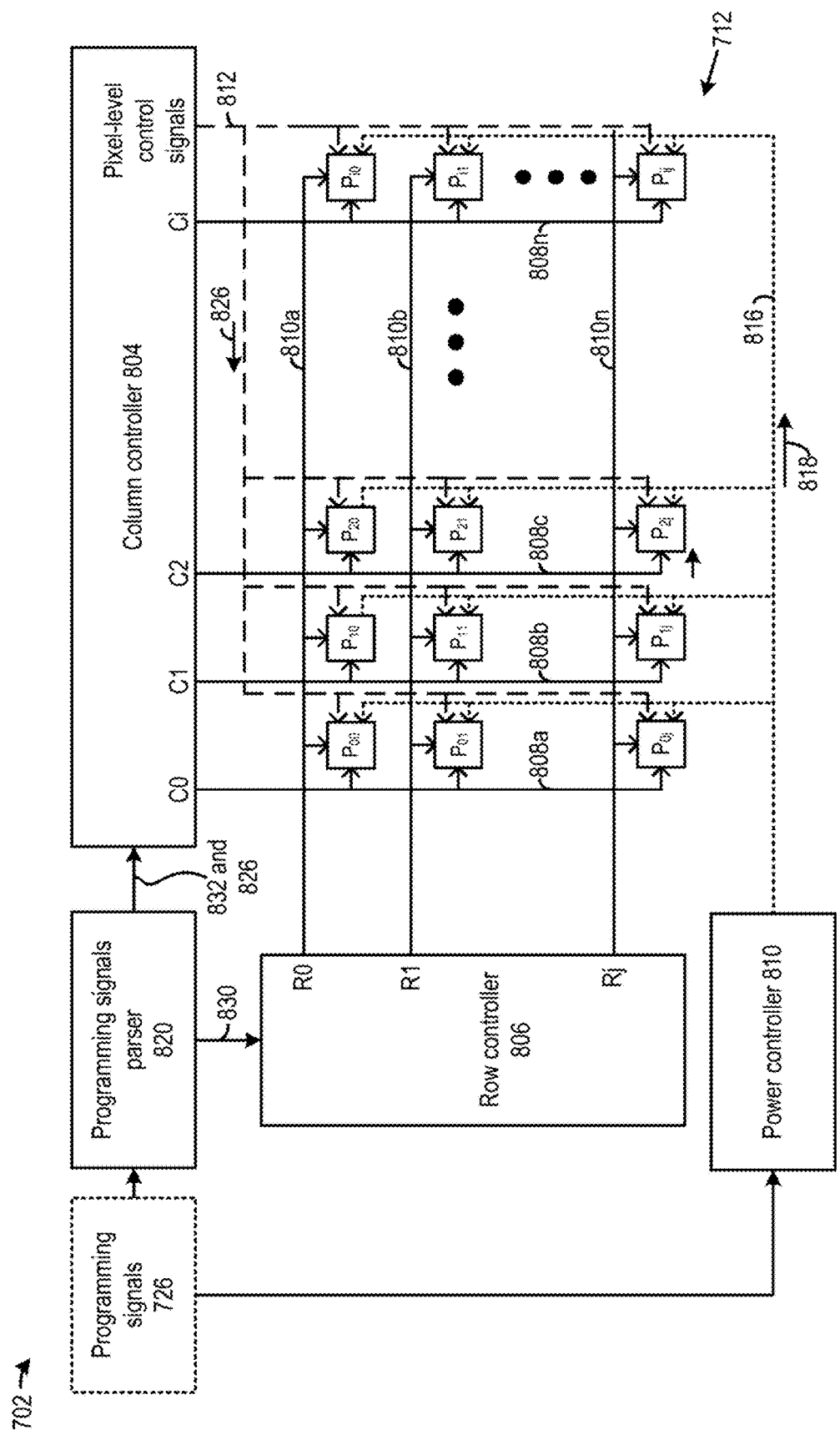
FIG. 8A, FIG. 8B, FIG. 8C, and FIG. 8D illustrate example components of the image processing system of FIGS. 7A-7C.

FIG. 8A, FIG. 8B, FIG. 8C, and FIG. 8D illustrate example components of image sensor 702 and image processor 704. FIG. 8A illustrates an example of image sensor 702. As shown in FIG. 8A, image sensor 704 may include a column controller 804, a row controller 806, and a power controller 807. Column controller 804 is connected with column buses 808 (e.g., 808a, 808b, 808c, ... 808n, etc.), whereas row controller 806 is connected with row buses 810 (e.g., 810a, 810b, ... 808n, etc.). One of row column controller 804 or row controller 806 is also connected with a programming bus 812 to transmit a pixel-level programming signals 826 targeted at a particular pixel cell or a group of pixel cells. Each box labelled $P_{00}$, $P_{01}$, $P_{0j}$, etc. can represent a pixel cell or a group of pixel cells (e.g., a group of 2×2 pixel cells) of array of pixel cells 712. Each pixel cell or group of pixel cells can be connected to one of column buses 808, one of row buses 810, programming bus 812, a power bus 816, and an output data bus to output pixel data (not shown in FIG. 8A). Each pixel cell (or each group of pixel cells) is individually addressable by column address signals 830 on column buses 808 provided by column controller 804, and row address signals 832 on row buses 810 provided by row controller 806, to receive pixel-level programming signals 826 via pixel-level programming bus 812 at a time. In addition, power controller 807 can control a voltage 818 supplied to each pixel cell via power bus 816 based on programming signals 726, to support a voltage scaling operation by controller 706 based on operation condition information provided by host processor 725 as described above.

Figure 8B:
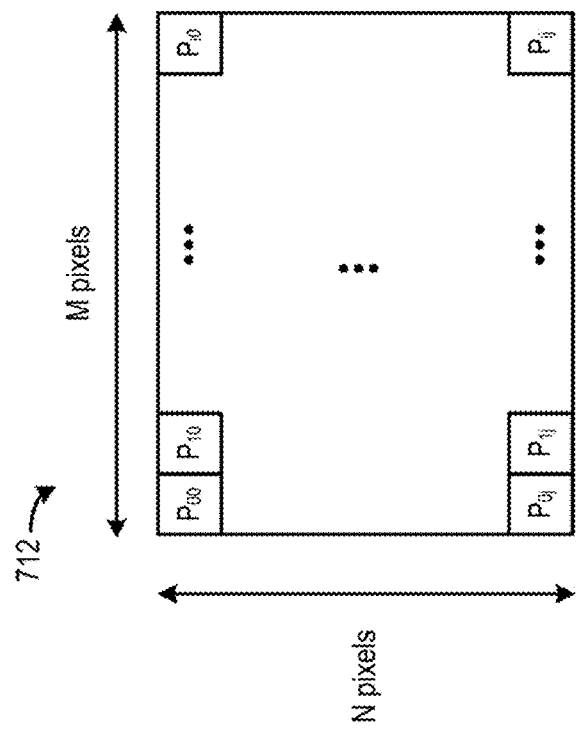
Figure 8B:
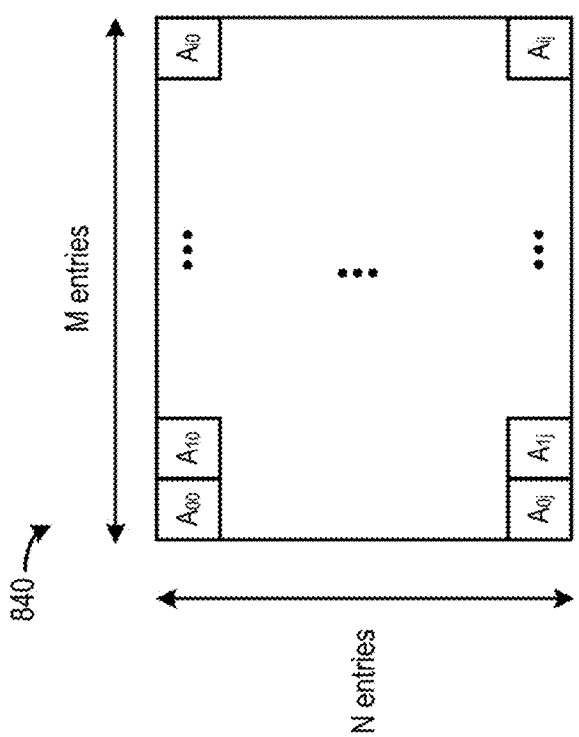

Referring back to FIG. 8A, image sensor 704 further includes a programming signals parser 820 which can extract pixel-level programming signals from programming signals 726. In some examples, programming signals 726 can be in the form of a pixel array programming map which can include programming data for each pixel cell or each group of pixel cells of array of pixel cells 712. FIG. 8B illustrates an example of pixel array programming map 840. As shown in FIG. 8B, pixel array programming map 840 can include a two-dimensional array of pixel-level programming data, with each pixel-level programming data of the two-dimensional array targeted at a pixel cell or a group of pixel cells of array of pixel cells 712. For example, in a case where each pixel-level programming data is targeted at a pixel cell, and assuming array of pixel cells 718 has a width of M pixels (e.g., M columns of pixels) and a height of N pixels (e.g., N rows of pixels), pixel array programming map 840 can also has a width of M entries (e.g., M columns of entries) and a height of N entries (e.g., N rows of entries), with each entry storing pixel-level programming data for a corresponding pixel cell. For example, the pixel-level programming data $A_{00}$ at entry (0, 0) of pixel array programming map 840 is targeted at pixel cell $P_{00}$ at pixel location (0, 0) of pixel cell array 718, whereas the pixel-level programming data $A_{01}$ at entry (0, 1) of pixel array programming map 720 is targeted at pixel cell $P_{01}$ at pixel location (0, 1) of pixel cell array 718. In a case where pixel-level programming data is targeted at a group of pixel cells, the number of entries of pixel array programming map 840 along the height and the width can be scaled based on a number of pixel cells in each group.

Pixel array programming map 840 can be configured to support the feedback operations described in FIG. 7B and FIG. 7C. For example, the pixel-level programming data stored at each entry can individually program each pixel cell (or each group of pixel cells) to, for example, power on or off, to enable or disable outputting of pixel data, to set a quantization resolution, to set a precision of output pixel data, to select a quantization operation (e.g., one of TTS, FD ADC, PD ADC), to set a frame rate, etc. Pixel array programming map 840 can be generated based on, for example, prediction of one or more ROIs, in which the pixel-level programming data for pixel cells within an ROI are different from the pixel-level programming data for pixel cells outside the ROI, as described above. Pixel array programming map 840 can be generated to selectively enable a subset of pixel cells (or groups of pixel cells) to perform subsampling operations, or to program all the pixel cells to operate at the same but adjusted frame rate.

Referring back to FIG. 8A, programming map parser 820 can parse pixel array programming map 840, which can be in a serial data stream, to identify the pixel-level programming data for each pixel cell (or each group of pixel cells). The identification of the pixel-level programming data can be based on, for example, a pre-determined scanning pattern by which the two-dimensional pixel array programming map is converted into the serial format, as well as the order by which the pixel-level programming data is received by programming signals parser 820 from the serial data stream. For each entry of programming data, programming signals parser 820 can generate a row address signal 830 and a column address signal 832, and transmit row address signal 830 and column address signal 832 to, respectively, row controller 806 and column controller 804 to select a pixel cells and transmit pixel-level programming signals 826 to the selected pixel cell (or group of pixel cells).

Figure 8C:
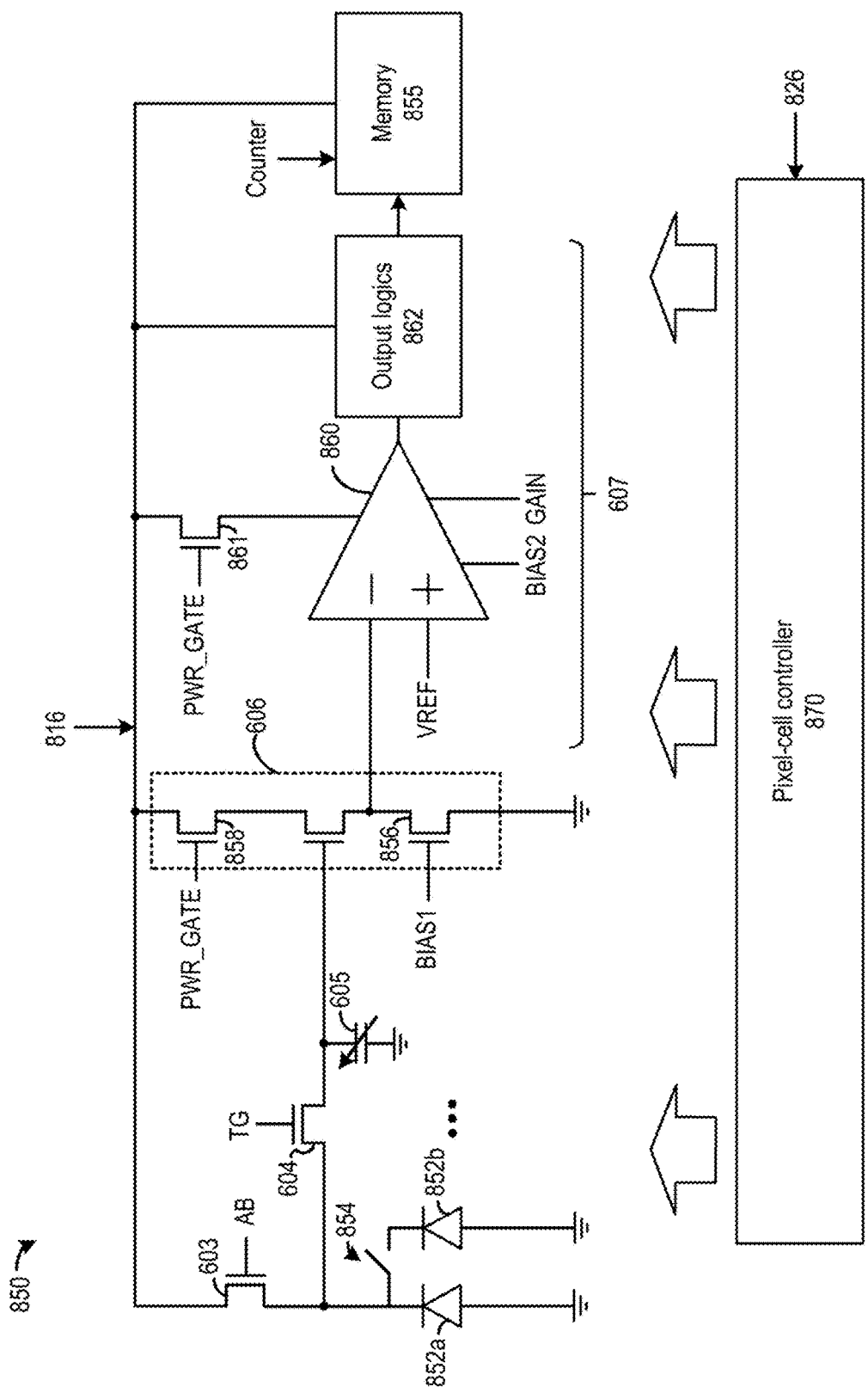

FIG. 8C illustrates example internal components of a pixel cell 850 of array of pixel cells 718, which can include at least some of the components of pixel cell 601 of FIG. 6A. Pixel cell 601 can receive a supply voltage via power bus 816. As shown in FIG. 8C, pixel cell 850 can include multiple photodiodes 852a, 852b, etc., each can be configured to detect light of a different frequency range. For example, photodiode 852a can detect visible light (e.g., monochrome, or one of red, green, or blue color), whereas photodiode 852b can detect infra light. Pixel cell 850 further includes a switch 854 (e.g., a transistor, a controller barrier layer, etc.) to control which photodiode outputs charge for pixel data generation.

In addition, pixel cell 850 further includes electronic shutter switch 603, transfer switch 604, charge storage device 605, buffer 606, quantizer 607 as shown in FIG. 6A, as well as a memory 855. Charge storage device 605 can have a configurable capacitance to set a charge-to-voltage conversion gain. In some examples, the capacitance of charge storage device 605 can be increased to store overflow charge for FD ADC operation for a medium light intensity, to reduce the likelihood of charge storage device 605 being saturated by the overflow charge. The capacitance of charge storage device 605 can also be decreased to increase the charge-to-voltage conversion gain for PD ADC operation for a low light intensity. The increase in the charge-to-voltage conversion gain can reduce quantization error and increase the quantization resolution. In some examples, the capacitance of charge storage device 605 can also be decreased during the FD ADC operation to increase the quantization resolution. Buffer 606 includes a current source 856 of which the current can be set by a bias signal BIAS1, as well as a power gate 858 which can be controlled by a PWR_GATE signal to turn on/off buffer 606. Buffer 606 can be turned off as part of disabling pixel cell 850.

In addition, quantizer 607 includes a comparator 860 and output logics 862. Comparator 860 can compare the output of buffer with a VREF to generate an output. Depending on a quantization operation (e.g., TTS, FD ADC, and PD ADC operations), comparator 60 can compare the buffered voltage with different VREF voltages to generate the output, and the output be further processed by output logics 862 to cause memory 855 to store a value from a free running counter as the pixel output. The bias current of comparator 860 can be controlled by a bias signal BIAS2 which can set the bandwidth of comparator 860, which can be set based on the frame rate to be supported by pixel cell 850. Moreover, the gain of comparator 860 can be controlled by a gain control signal GAIN. The gain of comparator 860 can be set based on a quantization resolution to be supported by pixel cell 850. Comparator 860 further includes a power switch 861 which can also be controlled by the PWR_GATE signal to turn on/off comparator 860. Comparator 860 can be turned off as part of disabling pixel cell 850.

In addition, output logics 862 can select the outputs of one of the TTS, FD ADC, or PD ADC operations and based on the selection, determine whether to forward the output of comparator 860 to memory 855 to store the value from the counter. Output logics 862 can include internal memory to store indications, based on the output of comparator 860, of whether the photodiode 852 (e.g., photodiode 852a) is saturated by the residual charge, and whether charge storage device 605 is saturated by the overflow charge. If charge storage device 605 is saturated by the overflow charge, output logics 862 can select TTS output to be stored in memory 855 and prevent memory 855 from overwriting the TTS output by the FD ADC/PD ADC output. If charge storage device 605 is not saturated but the photodiodes 852 are saturated, output logics 862 can select the FD ADC output to be stored in memory 855; otherwise output logics 862 can select the PD ADC output to be stored in memory 855. In some examples, instead of the counter values, the indications of whether photodiodes 852 are saturated by the residual charge and whether charge storage device 605 is saturated by the overflow charge can be stored in memory 855 to provide the lowest precision pixel data.

In addition, pixel cell 850 may include a pixel-cell controller 870, which can include logic circuits to generate control signals such as AB, TG, BIAS1, BIAS2, GAIN, VREF, PWR_GATE, etc. Pixel-cell controller 870 can also be programmed by pixel-level programming signals 826. For example, to disable pixel cell 850, pixel-cell controller 870 can be programmed by pixel-level programming signals 826 to de-assert PWR_GATE to turn off buffer 606 and comparator 860. Moreover, to increase the quantization resolution, pixel-cell controller 870 can be programmed by pixel-level programming signals 826 to reduce the capacitance of charge storage device 605, to increase the gain of comparator 860 via GAIN signal, etc. To increase the frame rate, pixel-cell controller 870 can be programmed by pixel-level programming signals 826 to increase BIAS1 signal and BIAS2 signal to increase the bandwidth of, respectively, buffer 606 and comparator 860. Further, to control the precision of pixel data output by pixel cell 850, pixel-cell controller 870 can be programmed by pixel-level programming signals 826 to, for example, connect only a subset of bits (e.g., most significant bits) of the counter to memory 855 so that memory 855 only stores the subset of bits, or to store the indications stored in output logics 862 to memory 855 as the pixel data. In addition, pixel-cell controller 870 can be programmed by pixel-level programming signals 826 to control the sequence and timing of AB and TG signals to, for example, adjust the exposure period and/or select a particular quantization operation (e.g., one of TTS, FD ADC, or PD ADC) while skipping the others based on the operation condition, as described above.

Figure 8D:
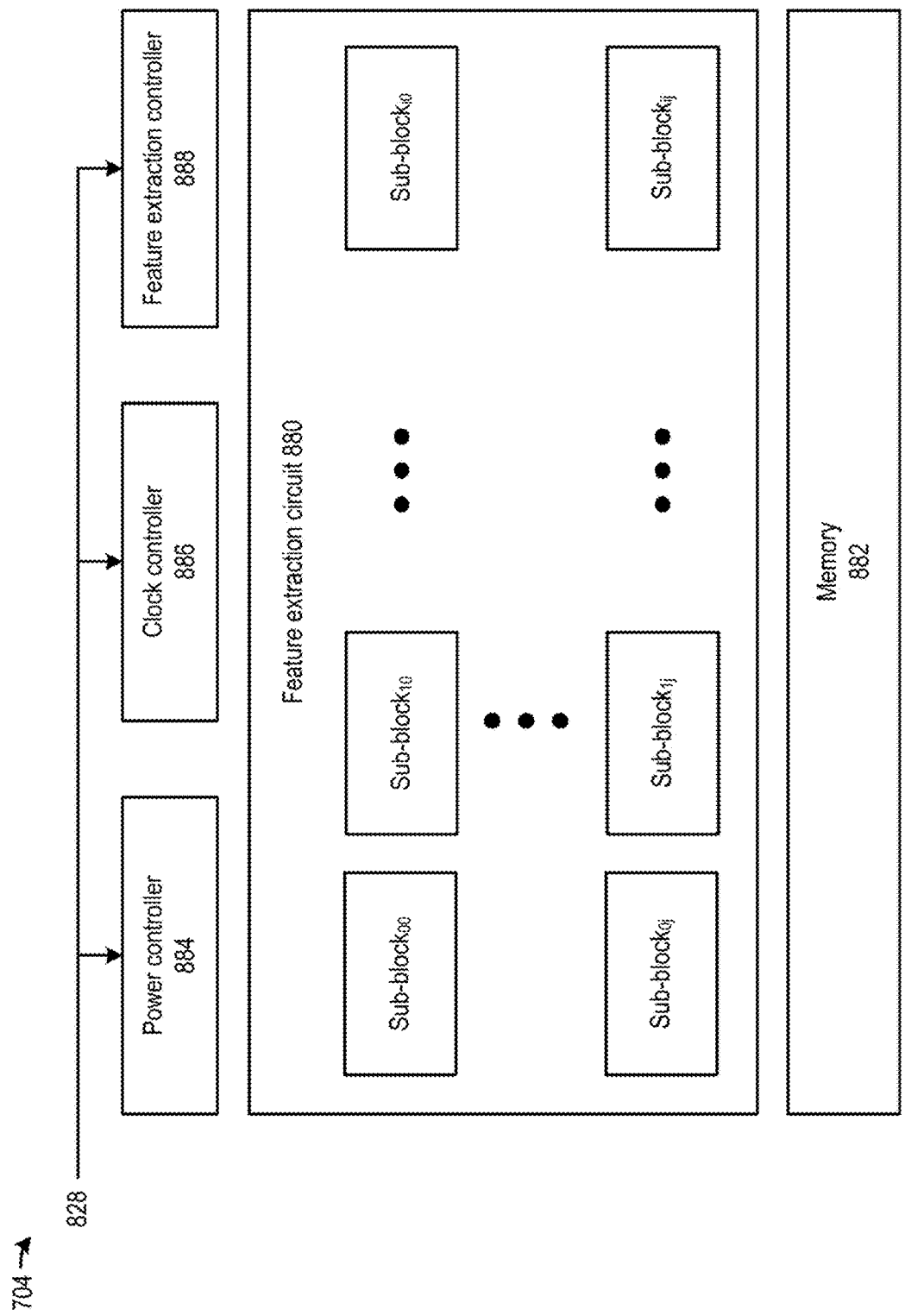

FIG. 8D illustrates example internal components of image processor 704. As shown in FIG. 8D, image processor 704 may include a feature extraction circuit 880 and a memory 882. Feature extraction circuit 880 may include an array of sub-blocks, such as sub-block$_{00}$, sub-block$_{10}$, sub-block$_{i0}$, sub-block$_{0j}$, sub-block$_{1j}$, sub-block$_{ij}$, etc. Each sub-block can be configured to extract features from a block of pixel data generated by array of pixel cells 712, such that the blocks of pixel data of an image frame can be processed in parallel to expedite the extraction process. Each sub-block can output data representing the extracted features, as well as the pixel locations of the extracted features. Memory 882 can provide on-chip memory to store the input data to the sub-blocks (e.g., the pixel data), various configuration data for the feature extraction operation, as well as the output of the sub-blocks of feature extraction circuit 880. Memory 882 may include, for example, spin tunneling random access memory (STRAM), non-volatile random access memory (NVRAM), etc. In some examples, image processor 704 may also include an interface to an off-chip memory (e.g., dynamic random access memory) to support the feature extraction operations at feature extraction circuit 880.

Feature extraction circuit 880 can employ various techniques to perform the feature extraction operation. In one example, each sub-block of feature extraction circuit 880 can perform a convolution operation between a block of pixel data with a filter including the pixels of a target feature to be extracted, in which the filter is superimposed with a portion of the block of pixel data at a particular stride location, and a sum of products of each element of the filter and each pixel within the portion can be determined. As the filter is shifted around within the block of pixels, a distribution of the sum of products with respect to different stride locations can be determined as the convolution outputs. The convolution outputs from a block of pixel data can be provided to controller 706, which can identify a peak of the convolution outputs, and if the peak exceeds a threshold, the controller can determine that the block of pixel data contains the target feature, whereas the stride location of the filter within the block of pixel data can provide the pixel locations of the target feature.

In some examples, each sub-block of feature extraction circuit 880 can include circuits to perform the aforementioned convolution operation. In some examples, feature extraction circuit 880 can include a field programmable gate array (FPGA), a digital signal processor (DSP), a linear solver unit, a micro-controller, etc. In some examples, feature extraction circuit 880 can include dedicated arithmetic circuits to perform the convolution operation. The arithmetic circuits of each sub-block can implement a neural network, such as a convolution neural network (CNN), to perform the convolution operation, in which the arithmetic circuit can represent a plurality of neural network layer. The first neural network layer comprises nodes each configured to multiply a pixel value with a weight which can be part of the convolution filter to generate an intermediate output. The second neural network layer can multiply the intermediate outputs from the first neural network layer with another set of weights to generate outputs. The outputs can indicate, for example, whether a target feature is detected in a block of pixel data, and its pixel location. Besides CNN, feature extraction circuit 880 may implement other neural network topologies/architectures, such as a stochastic neural network, a spike neural network, neuromorphic computing unit, etc.

The weights of the neural network can be stored and fetched from memory 882. The weights can be generated by a training process to maximize the likelihood of the neural network correctly detecting a feature in a block of pixel data. The training process can be performed off-line, on-line, or a combination of both. In an off-line training process, the weights can be fetched to image processor 704 before the feature extraction operation (e.g., when image processor 704 is fabricated or powered up). The weights can be obtained from a training process based on a training data set that cover a range of image data expected to be processed by image processor 704. The training data set can be stored in a cloud environment, and the training can also be performed in the cloud environment as an off-line training process. The weights obtained from the off-line training process can be common for all image processors 704 of different imaging systems 700.

In an on-line training process, the weights used by image processor 704 can be obtained while image processor 704 receives image data of the actual object to be detected. An example application may be eye tracking (e.g., based on images of an eye captured by the image sensor). As part of the on-line training process, image processor 704 can operate in a training mode in which it receives pixel data of the eye of the user when the user is asked to look at specific targets or locations in space. Through the training process, image processor 704 can adjust the weights to maximize the likelihood of correctly identifying the eye of the user. In such a case, the weights used by image processor 704 of a particular imaging system 700 can be different from the weights used by image processor 704 of another imaging system 700, as the weights are optimized for a specific user and/or for a specific operation condition.

In some examples, the weights used by image processor 704 can be obtained by a combination of off-line and on-line training processes. For example, the weights used by the first neural network layer can be generic weights used to extract generic features of an object, whereas the weights of the upper neural network layers can be trained in an on-line training process to become specific to a user and/or to a specific operation condition.

In addition to pixel data and the weights, feature extraction circuit 880 can also perform the feature extraction operation based on other inputs, such as sensor data from an inertial measurement unit, which can detect the motion and location of imaging system 700. Based on the sensor data, feature extraction circuit 880 can adjust the feature extraction operation account for the motion of imaging system 700, and/or the relative physical location of imaging system 700 with respect to the target object to be detected, all of which may be reflected in the pixel data.

Besides feature extraction circuit 880 and memory 882, image processor 704 may further include a power controller 884, a clock controller 886, and a feature extraction controller 888, each of which can be controlled by programming signals 828 from controller 706. Power controller 884 can control a supply voltage of image processor 704 based on programming signals 828 from controller 706. For example, based on a target power usage, a frame rate, a latency requirement, etc., power controller 884 can scale up or down the supply voltage to feature extraction circuit 880. In addition, clock controller 886 can control, based on programming signals 828, a frequency of a clock signal supplied to feature extraction circuit 880, to set an operating frequency of feature extraction circuit 880. The operating frequency can be set based on, for example, a frame rate of pixel data supplied by image sensor 702, a target power usage, a latency requirement, etc.

In addition, feature extraction controller 888 can control the feature extraction operations at feature extraction circuit 880 based on programming signals 828. For example, feature extraction controller 888 can disable one or more sub-blocks of feature extraction circuit 880 based on the ROI information from controller 706 when those sub-blocks are not expected to receive pixel data from image sensor 702. As another example, feature extraction controller 888 can also control the outputs of sub-block, such as a precision (e.g., bit-length) of the outputs, whether the outputs are compressed, etc. Feature extraction circuit 880 can control feature extraction circuit 880 to skip the feature extraction operation and forward the pixel data directly to, for example, host processor 725 or other external systems. This can happen when, for example, controller 706 determines that feature extraction circuit 880 cannot complete the feature extraction operations on time (e.g., based on a power/frequency setting by power controller 884 and clock controller 886), and determines that the feature extraction operation is to be performed by an external system.

Figure 9A:
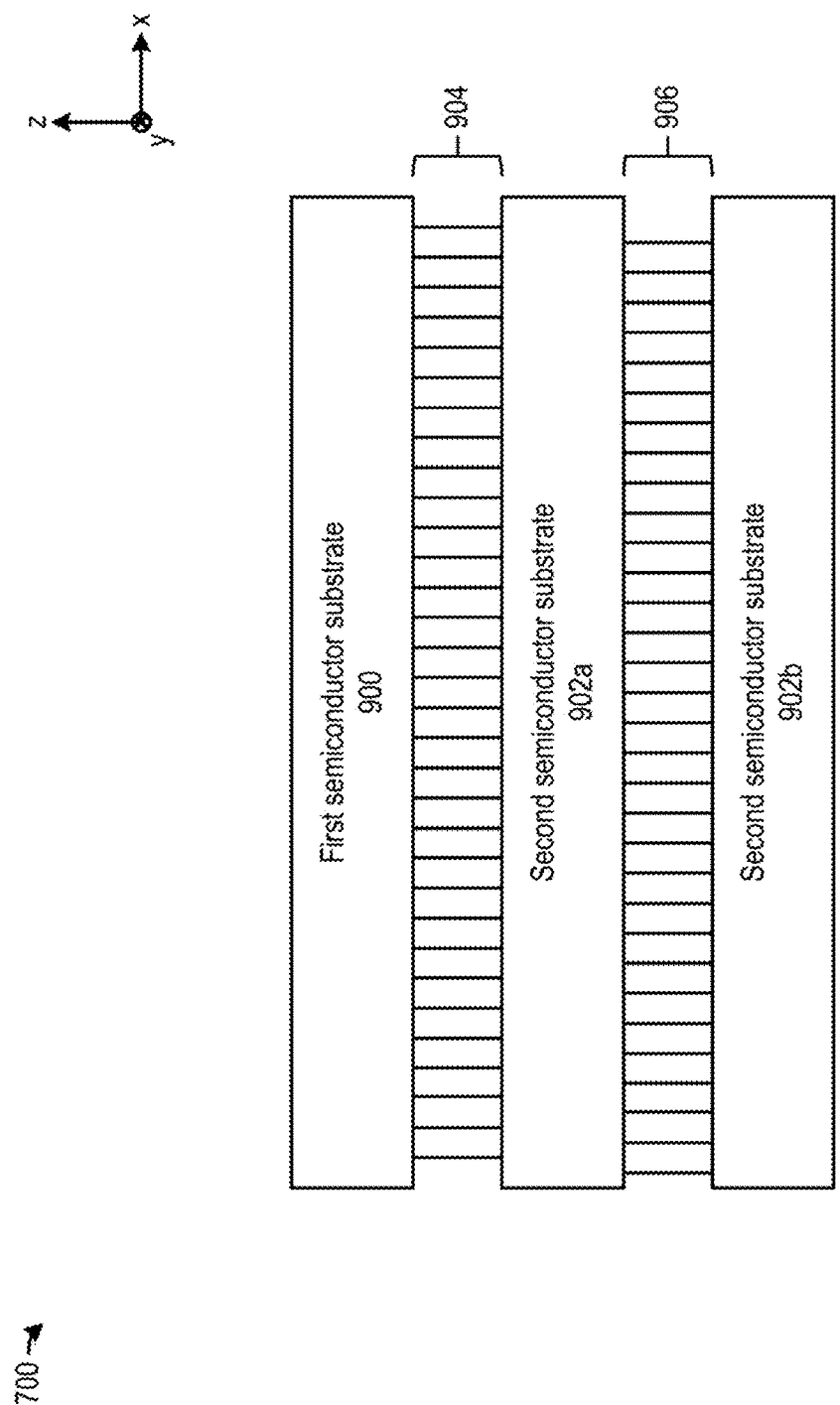
FIG. 9A and FIG. 9B illustrate example physical arrangements of the imaging system of FIG. 7A-FIG. 7C.
Figure 9B:
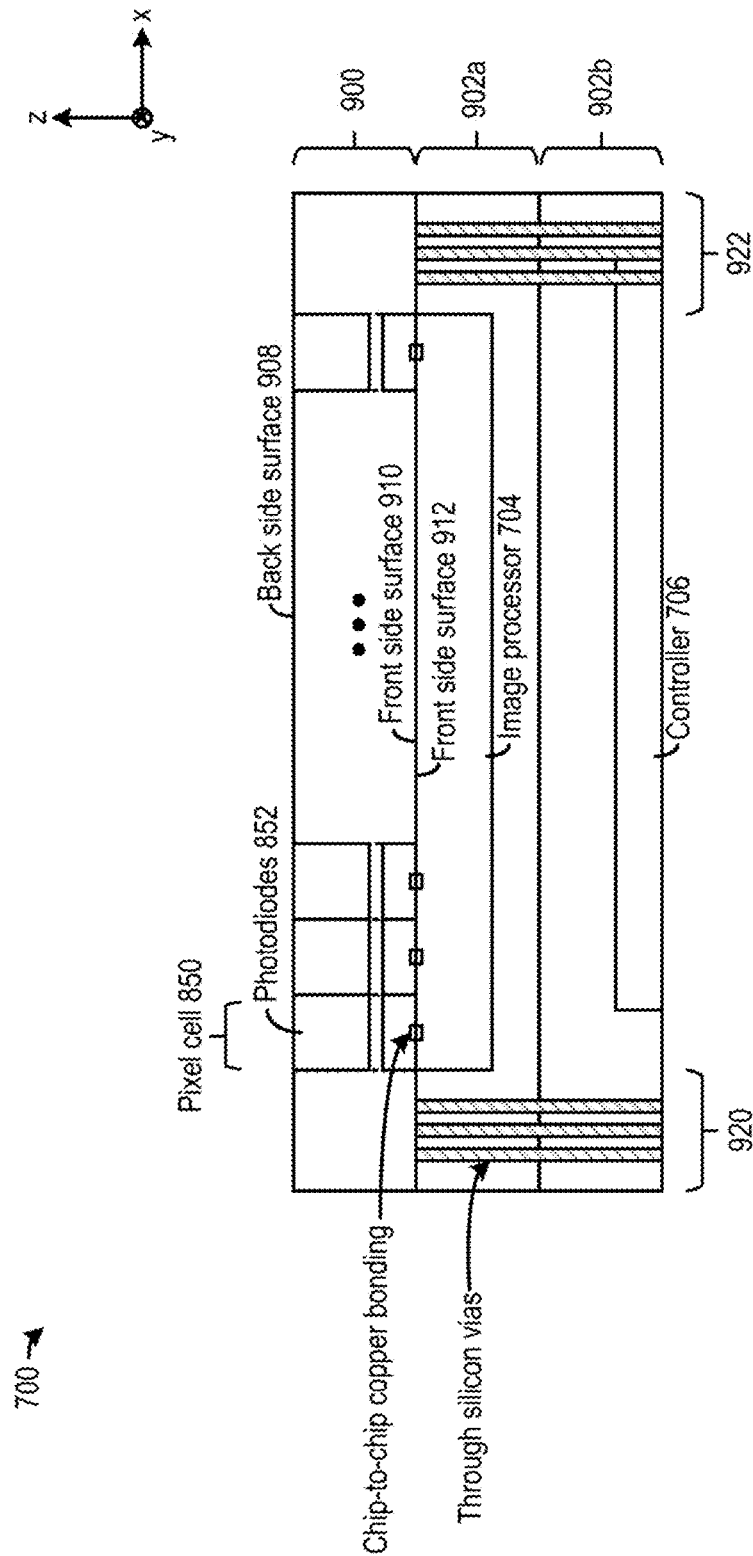

FIG. 9A and FIG. 9B illustrate examples of physical arrangements of image sensor 702, image processor 704, and controller 706 in imaging system 700. As shown in FIG. 9A, imaging system 700 may include a first semiconductor substrate 900 that includes some of the components of image sensor 702, such as photodiodes of the pixel cells, and one or more second semiconductor substrates 902 that include the quantizers of the pixel cells, image processor 704, and controller 706. In some examples, one or more second semiconductor substrates 902 includes a second semiconductor substrate 902a that includes image processor 704 and a second semiconductor substrate 902b that includes controller 706. In some examples, image processor 704 and controller 706 can be in the same second semiconductor substrate 902.

In some examples, first semiconductor substrate 900 and one or more second semiconductor substrates 902 can form a stack along a vertical direction (e.g., represented by z-axis), with vertical interconnects 904 and 906 to provide electrical connection among the substrates. Such arrangements can reduce the routing distance of the electrical connections among image sensor 702, image processor 704, and controller 706, which can increase the speed of transmission of data (especially pixel data) from image sensor 702 to image processor 704 and reduce the power required for the transmission.

FIG. 9B illustrates example details of the stack structure of imaging system 700. As shown in FIG. 9B, first semiconductor substrate 900 may include a back side surface 908 configured as a light receiving surface and includes photodiodes of each pixel cell, and a front side surface 910 on which transfer transistor 604 and charge storage device 605 (e.g., a floating drain of transfer transistor 604) are implemented, whereas buffer 606, quantizer 607, as well as image processor 704 are implemented below a front side surface 912 of second semiconductor substrate 902a. Front-side surface 910 of first semiconductor substrate 900 may be electrically connected with front-side surface 912 of second semiconductor substrate 902a by vertical interconnects 904 which include chip-to-chip copper bonding. The chip-to-chip copper bonding can provide pixel interconnects between, for example, the transfer transistor 604 of each pixel cell and the buffer 606 of each pixel cell. The quantizer 607 of each pixel cell can then be connected to image processor 704 via horizontal metal interconnects (e.g., parallel with the x or y axes) which are not shown in FIG. 9B.

In addition, imaging system 700 further includes through silicon vias (TSV) which provide vertical interconnects between, for example, image sensor 702 and controller 706. The TSVs can be on shoulder regions 920 and 922 of the stack and can transmit, for example, programming signals 726. The TSVs penetrate through second semiconductor substrate 902a and can be connected with image processor 704 via horizontal metal interconnects (not shown in FIG. 9B) to provide programming signals 728 to image processor 704.

Figure 10:
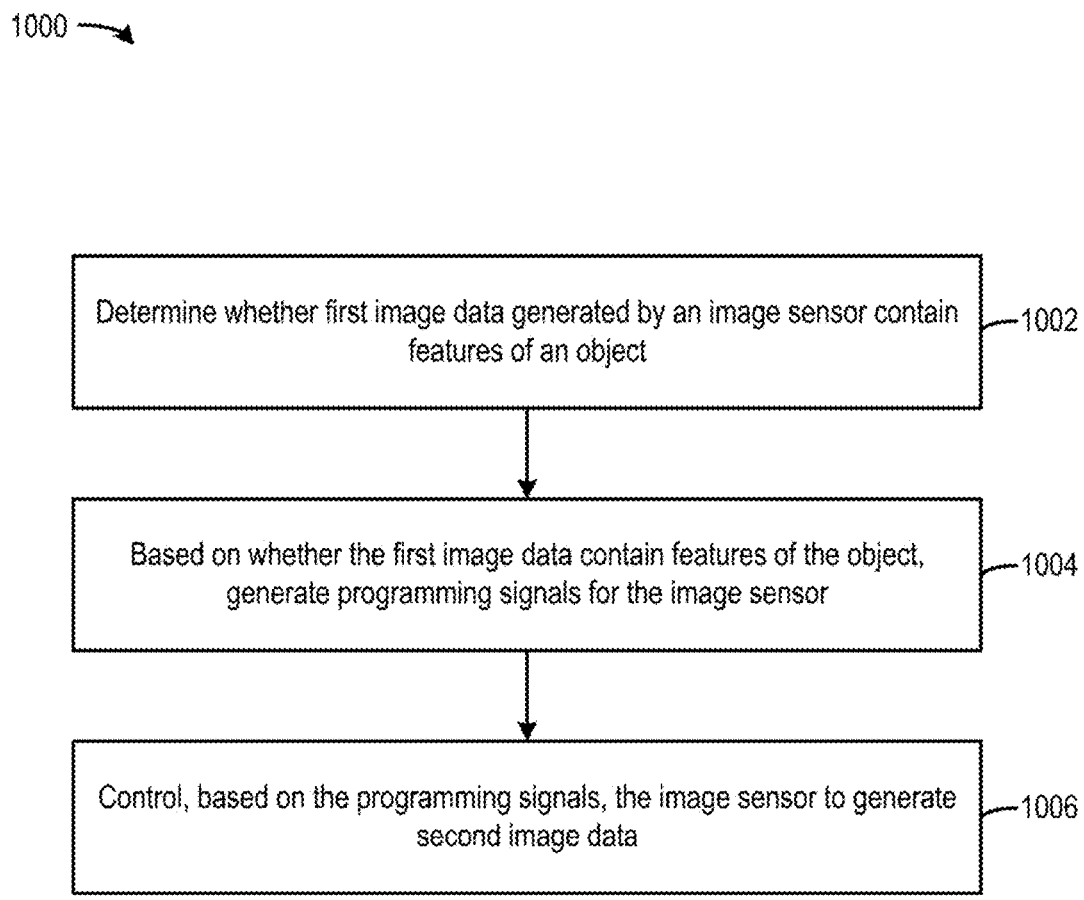
FIG. 10 illustrates a flowchart of an example process for generating image data.

FIG. 10 illustrates a method 100 of operating an image sensor. Method 1000 can be performed by, for example, imaging system 700 of FIG. 7A including, for example, image sensor 702, image processor 704, and controller 706. Image sensor 702 can include an array of pixel cells configured to generate image data. The image sensor can be implemented on a first semiconductor substrate, whereas the image processor and the controller can be implemented on one or more second semiconductor substrates, with the first semiconductor substrate and the one or more second semiconductor substrates forming a stack and housed within a semiconductor package. In some examples, the image processor and the controller can be part of a single compute block implemented on a single semiconductor substrate, while in other examples, the image processor and the controller can be separate processing circuit blocks implemented on different semiconductor substrates. The image sensor, the image processor, and the controller can be electrically connected using vertical electrical connections, such as through-silicon vias (TSV), chip-to-chip copper bonding, etc.

In step 1002, controller 706 can determine whether first image data from image sensor 702 contains the features of an object. The determination can be based on the output of image processor 704, which can extract features of the object from the first image. The image processor can employ various techniques to extract features of an object. For example, the image processor may implement a neural network, such as convolution neural network (CNN), to perform arithmetic operations on the pixel data with weights to perform the extraction. The image processor may include memory devices (e.g., spin tunneling random access memory (STRAM), non-volatile random access memory (NVRAM), etc.) to store the weights. The image processor may receive the weights offline, and/or generate the weights based on a training process, or a combination of both. For example, in a case where the image processor is to extract features of an eye of the user, the image processor can obtain a set of initial weights offline. The image processor can then update the initial weights in a training mode where the image sensor captures images of the eye when the user is asked to look at a specific object at a specific physical location, and the image processor updates the initial weights so that features of the eyes can be extracted from pixel locations corresponding to the physical location. The image processor may also receive sensor data from other sensors, such as an inertial measurement unit (IMU), which can contain physical location information of the object, and perform extraction of the features of the object based on the sensor data.

In step 1004, controller 706 can generate programming signals for the image sensor based on whether the first image data contain features of the object. Controller 706 can then control, based on the programming signals, the image sensor to generate second image data, in step 1006.

Specifically, in a case where the image processor outputs the locations of the features of the object to the controller in a first image frame containing the first image data, the controller can determine a region of interest (ROI) in a second image frame to be generated by the image sensor. The controller can determine the ROI based on, for example, a motion model of the object to predict the pixel locations of the object in the second image frame based on the pixel locations of the features of the object in the first image frame. The controller can then generate a first subset of the programming signals for a first subset of the array of pixel cells in the ROI and a second subset of the programming signals for a second subset of the array of pixel cells outside the ROI. The different subsets of the programming signals can configure the corresponding subsets of the array of pixel cells differently. For example, the first subset of the programming signals can power on the first subset of pixel cells and/or enable the outputting of pixel data by the first subset of pixel cells, whereas the second subset of the programming signals can power off the second subset of pixel cells and/or disable the outputting of pixel data by the second subset of pixel cells. As another example, the first subset of the programming signals can increase the quantization resolution, the bit lengths of pixel data, etc., with respect to the second subset of pixel cells by the second subset of the programming signals. In a case where each pixel cell includes multiple photodiodes configured to sense light of different frequency ranges, the image processor can extract features corresponding to different frequency ranges, and the controller can determine ROIs for the different frequency ranges and generate the programming signals based on the ROIs for the different frequency ranges.

On the other hand, in a case where the image processor outputs that the features of the object are not in the first frame, and/or that the pixel locations of the object remain static across a number of frames, the controller can generate programming signals to adjust various aspects of the operations at the image sensor. For example, the controller can control the image sensor to perform a sub-sampling operation (e.g., only a subset of pixel cells are turned on and/or are enabled to output pixel data), to reduce the frame rate of the image sensor, etc.

In some examples, the controller can also control the feature extraction operations of the image processor. For example, based on an operation condition (e.g., a density of features of a scene, available power to the image system, a light condition, etc.), the controller can adjust the operating voltage of the image sensor, the speed at which the image processor extracts features of the object, etc. The controller can also provide the predicted location of ROI back to the image processor so that the image processor only extract features from the ROI in subsequent image frames. The controller can also disable part of the image processor to achieve a target efficiency based on, for example, a bit length of the pixel data output by the pixel cells. In a case where the controller determines that image processor cannot complete the extraction of the features (e.g., under a target power usage, at a required frame rate, etc.), the controller can also transmit at least part of the pixel data of the image sensor to an external system (e.g., a host) to perform the feature extraction. The controller can also transmit the extracted features to the host to support various host applications (e.g., eye tracking, SLAM, etc.).

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
an image sensor comprising an array of pixel cells, each pixel cell including one or more photodiodes and circuits to capture image frames and generate image data, the photodiodes being formed in a first semiconductor substrate; and
a controller formed in one or more second semiconductor substrates that include the circuits of the array of pixel cells, the first and second semiconductor substrates forming a stack and housed within a semiconductor package;
wherein the controller is configured to:
determine whether first image data from a first image frame generated by the image sensor contains features of an object, the first image frame captured by the image sensor;
based on whether the first image data contains the features of the object, generate programming signals for the image sensor; and
control, based on the programming signals, the image sensor to generate second image data associated with a second image frame;
wherein a first subset of the programming signals control at least one of a first power consumed by a first subset of the array of pixel cells, a first quantization resolution of first pixel data output by the first subset of the array of pixel cells, or a first bit length of the first pixel data; and
wherein a second subset of the programming signals control at least one of a second power consumed by a second subset of the array of pixel cells, a second quantization resolution of second pixel data output by the second subset of the array of pixel cells, or a second bit length of the second pixel data.

2. The apparatus of claim 1, further comprising an image processor configured to extract the features of the object;
wherein the image processor is implemented in the one or more second semiconductor substrates.

3. The apparatus of claim 2, wherein the image processor is configured to provide pixel locations of the extracted features of the object in the first image frame to the controller;
wherein the controller is configured to:
determine, based on the pixel locations of the extracted features, a region of interest (ROI) in the second image frame containing the second image data; and
generate the programming signals based on the ROI.

4. The apparatus of claim 3, wherein the controller is configured to determine the ROI in the second image frame based on a motion model of the object.

5. The apparatus of claim 3, wherein the programming signals comprise a first subset of programming signals targeted at a first subset of the array of pixel cells within the ROI and a second subset of programming signals targeted at a second subset of the array of pixel cells.

6. The apparatus of claim 5, wherein the controller is configured to control all pixel cells of the array of pixel cells to output pixel data for the first image frame;
wherein the first subset of programming signals control the first subset of the array of pixel cells to output pixel data for the second image frame; and
wherein the second subset of programming signals control the second subset of the array of pixel cells not to output pixel data for the second image frame.

7. The apparatus of claim 3, wherein each pixel cell of the array of pixel cells is individually addressable; and
wherein the programming signals comprise pixel-level signals individually targeted at each pixel cell.

8. The apparatus of claim 3, wherein the image processor is configured to:
receive, from a second sensor, position information indicating a physical position of the object; and extract the features of the object from the first image data based on the position information.

9. The apparatus of claim 2, wherein the controller is configured to:
receive an indication from the image processor that the first image data does not contain the features of the object; and
based on the indication, generate the programming signals to control the image sensor to perform a sub-sampling operation based on at least one of: disabling a subset of the array of pixel cells, or controlling the subset of the array of pixel cells not to output pixel data.

10. The apparatus of claim 2, wherein the image processor implements a neural network to extract the features of the object.

11. The apparatus of claim 10, wherein weights of the neural network are obtained when the apparatus operates in a training mode and obtains image data of the object.

12. The apparatus of claim 2, wherein the programming signals are first programming signals;
wherein the image processor comprises a plurality of sub-blocks, each sub-block configured to extract the features of the object from a block of image data from the image sensor; and
wherein the controller is configured to transmit second programming signals to the image processor to disable a subset of the sub-blocks for the extraction of the features of the object from the second image data based on a result of extraction of the features of the object from the first image data by the image processor.

13. The apparatus of claim 2, wherein the programming signals are first programming signals; and
wherein the controller is configured to transmit second programming signals to the image processor to adjust at least one of: a supply voltage of the image processor, or an operation frequency of the image processor.

14. The apparatus of claim 2, wherein the programming signals are first programming signals; and
wherein the controller is configured to transmit second programming signals to the image processor to control the image processor not to extract the features of the object from the second image data and to forward the second image data to an external system.

15. The apparatus of claim 1, wherein the controller is configured to generate the programming signals to scale a supply voltage of the image sensor.

16. The apparatus of claim 1, further comprising:
pixel interconnects implemented by chip-to-chip copper bonding between the first semiconductor substrate and the one or more second semiconductor substrates to transmit signals generated by the photodiodes in the first semiconductor substrate to the circuits of the each pixel cell in the one or more second semiconductor substrates; and
through silicon vias (TSV) between to transmit the first semiconductor substrate and the one or more second semiconductor substrates to transmit the programming signals from the controller to the image sensor.

17. The apparatus of claim 1, wherein the one or more photodiodes comprise a first photodiode and a second photodiode;
wherein the first photodiode is configured to detect light in a first wavelength range;
wherein the second photodiode is configured to detect light in a second wavelength range; and
wherein the first image data are generated based on at least one of outputs of the first photodiodes of the array of pixel cells or outputs of the second photodiodes of the array of pixel cells.

18. A method, comprising:
capturing, by an image sensor, a first image frame;
determining, by a controller, whether first image data from the first image frame generated by an image sensor contains features of an object, wherein the image sensor and the controller forms a stack and are housed within a semiconductor package;
based on whether the first image data contains features of the object, generating, by the controller, programming signals for the image sensor; and
controlling, by the controller and based on the programming signals, the image sensor to generate second image data associated with a second image frame;
wherein a first subset of the programming signals control at least one of a first power consumed by a first subset of pixel cells of the image sensor, a first quantization resolution of first pixel data output by the first subset of the pixel cells, or a first bit length of the first pixel data; and
wherein a second subset of the programming signals control at least one of a second power consumed by a second subset of the pixel cells, a second quantization resolution of second pixel data output by the second subset of the pixel cells, or a second bit length of the second pixel data.

19. The method of claim 18, further comprising:
extracting, by an image processor, the features of the object,
wherein the image processor is part of the stack and housed within the semiconductor package.

20. The method of claim 19, further comprising:
determining, by the image processor, pixel locations of the extracted features of the object in the first image frame;
determining, by the controller and based on the pixel locations of the extracted features, a region of interest (ROI) in the second image frame containing the second image data; and
generating, by the controller, the programming signals based on the ROI.

* * * * *